(12) United States Patent
Feng et al.

(10) Patent No.: US 11,176,871 B2
(45) Date of Patent: Nov. 16, 2021

(54) SHIFT REGISTER UNIT AND DRIVING METHOD THEREOF, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,018

(22) PCT Filed: Dec. 14, 2018

(86) PCT No.: PCT/CN2018/121281
§ 371 (c)(1),
(2) Date: Dec. 16, 2019

(87) PCT Pub. No.: WO2019/227901
PCT Pub. Date: Dec. 5, 2019

(65) Prior Publication Data
US 2021/0142713 A1  May 13, 2021

(30) Foreign Application Priority Data
May 31, 2018 (CN) .......................... 201810553294.9

(51) Int. Cl.
*G09G 3/20* (2006.01)
*G09G 3/36* (2006.01)
*G11C 19/28* (2006.01)

(52) U.S. Cl.
CPC .......... *G09G 3/2092* (2013.01); *G11C 19/28* (2013.01); *G09G 2310/0286* (2013.01); *G09G 2310/061* (2013.01)

(58) Field of Classification Search
CPC .......... G09G 3/2092; G09G 3/32; G09G 3/36; G09G 2310/0286; G11C 19/28
See application file for complete search history.

(56) References Cited

U.S. PATENT DOCUMENTS

2017/0193885 A1* 7/2017 Feng .................. G11C 19/184
2018/0337682 A1* 11/2018 Takasugi ............ G09G 3/3241

FOREIGN PATENT DOCUMENTS

CN 1868003 A 11/2006
CN 202771776 U 3/2013
(Continued)

OTHER PUBLICATIONS

First Office Action dated Apr. 28, 2021 for application No. IN202047003734.

*Primary Examiner* — Xuemei Zheng
(74) *Attorney, Agent, or Firm* — Nath, Goldberg & Meyer; Joshua B. Goldberg

(57) ABSTRACT

A shift register unit, a driving method thereof, a gate driving circuit and a display device. The shift register unit includes a blanking input circuit, a display input circuit, an output circuit, a first control circuit and a second control circuit. The blanking input circuit inputs a blanking pull-up signal to a first node according to a blanking input signal; the display input circuit inputs a display pull-up signal to the first node in response to a display input signal; the output circuit outputs an composite output signal to an output terminal (Continued)

under the control of the first node; the first control circuit controls a level of a second node under the control of the first node; and the second control circuit controls the level of the second node in response to a blanking pull-down control signal.

29 Claims, 14 Drawing Sheets

(56) References Cited

FOREIGN PATENT DOCUMENTS

| | | |
|---|---|---|
| CN | 104900211 A | 9/2015 |
| CN | 105679229 A | 6/2016 |
| CN | 106548747 A | 3/2017 |

* cited by examiner

# SHIFT REGISTER UNIT AND DRIVING METHOD THEREOF, GATE DRIVING CIRCUIT AND DISPLAY DEVICE

This is a National Phase Application filed under 35 U.S.C. 371 as a national stage of PCT/CN2018/121281, filed Dec. 14, 2018, an application claiming priority from the Chinese patent application No. 201810553294.9, filed on May 31, 2018, the disclosure of each of which is incorporated herein by reference in its entirety.

TECHNICAL FIELD

The embodiments of the disclosure relate to a shift register unit and a driving method thereof, and a gate driving circuit and a display device.

BACKGROUND

In the field of display technology, a pixel array of a liquid crystal display panel or an Organic Light Emitting Diode (OLED) display panel, for example, generally includes a plurality of rows of gate lines and a plurality of columns of data lines which are intersected with each other. The gate lines may be driven by a gate driving circuit. The gate driving circuit is generally integrated in a gate integrated circuit. In the design of the gate integrated chip, an area of the chip is a main factor influencing the cost of the chip, and how to effectively reduce the area of the chip is a problem which needs to be considered by technical developers.

SUMMARY

At least one embodiment of the present disclosure provides a shift register unit, including a blanking input circuit, a display input circuit, an output circuit, a first control circuit and a second control circuit, wherein the blanking input circuit is configured to input a blanking pull-up signal to a first node in a blanking period of one frame according to a blanking input signal; the display input circuit is configured to input a display pull-up signal to the first node in a display period of the frame in response to a display input signal; the output circuit is configured to output a composite output signal to an output terminal under the control of a level of the first node; the first control circuit is configured to control a level of a second node under the control of the level of the first node; and the second control circuit is configured to control the level of the second node in response to a blanking pull-down control signal.

For example, the shift register unit provided in some embodiments of the present disclosure further includes a third control circuit, and the third control circuit is configured to control the level of the second node in response to a display pull-down control signal.

For example, the shift register unit provided in some embodiments of the present disclosure further includes a noise reduction circuit, and the noise reduction circuit is configured to reduce noise of the first node and the output terminal under the control of the level of the second node.

For example, in the shift register unit provided in some embodiments of the present disclosure, the second control circuit includes a first transistor, and the blanking pull-down control signal includes a first clock signal; and a gate of the first transistor is configured to be coupled to a first clock signal terminal to receive the first clock signal, a first electrode of the first transistor is configured to be coupled to the second node, and the second electrode of the first transistor is configured to receive a first voltage of a first voltage terminal.

For example, in the shift register unit provided in some embodiments of the present disclosure, the second control circuit further includes a second transistor, and the blanking pull-down control signal further includes a first control signal; a gate of the second transistor is configured to be coupled to a first control signal terminal to receive a first control signal, a first electrode of the second transistor is configured to be coupled to the second electrode of the first transistor, and a second electrode of the second transistor is configured to be coupled to the first voltage terminal to receive the first voltage.

For example, in the shift register unit provided in some embodiments of the present disclosure, the third control circuit includes a third transistor; a gate of the third transistor is configured to be coupled to a display pull-down control signal terminal to receive the display pull-down control signal, a first electrode of the third transistor is configured to be coupled to the second node, and a second electrode of the third transistor is configured to be coupled to a first voltage terminal to receive a first voltage.

For example, in the shift register unit provided in some embodiments of the present disclosure, the blanking input circuit includes: a charging sub-circuit configured to input the blanking input signal to a control node in response to a second clock signal; a storage sub-circuit configured to store the blanking input signal input by the charging sub-circuit; and an isolator sub-circuit configured to input the blanking pull-up signal to the first node under the control of a level of the control node and a first clock signal.

For example, in the shift register unit provided in some embodiments of the present disclosure, the charging sub-circuit includes a fourth transistor having a gate configured to be coupled to a second clock signal terminal to receive the second clock signal, a first electrode configured to be coupled to a blanking input signal terminal to receive the blanking input signal, and a second electrode configured to be coupled to the control node; the storage sub-circuit includes a first capacitor having a first electrode configured to be coupled to the control node and a second electrode configured to be coupled to a first voltage terminal to receive a first voltage; the isolator circuit includes a fifth transistor and a sixth transistor, a gate of the fifth transistor is configured to be coupled to the control node, a first electrode of the fifth transistor is configured to receive the blanking pull-up signal, a second electrode of the fifth transistor is configured to be coupled to a first electrode of the sixth transistor, a gate of the sixth transistor is configured to be coupled to a first clock signal terminal to receive the first clock signal, and a second electrode of the sixth transistor is configured to be coupled to the first node.

For example, in the shift register unit provided in some embodiments of the present disclosure, the first electrode of the fifth transistor is coupled to the third clock signal terminal to receive a third clock signal as the blanking pull-up signal.

For example, in the shift register unit provided in some embodiments of the present disclosure, the display input circuit includes a seventh transistor; and a gate of the seventh transistor is configured to be coupled to a display input signal terminal to receive the display input signal, a first electrode of the seventh transistor is configured to receive the display pull-up signal, and a second electrode of the seventh transistor is configured to be coupled to the first node.

For example, in the shift register unit provided in some embodiments of the present disclosure, the first electrode of the seventh transistor is coupled to a second voltage terminal to receive a second voltage as the display pull-up signal.

For example, in the shift register unit provided in some embodiments of the present disclosure, the output circuit includes at least one shift signal output and at least one pixel signal output.

For example, in the shift register unit provided in some embodiments of the present disclosure, the output circuit includes an eighth transistor, a ninth transistor and a second capacitor; a gate of the eighth transistor is configured to be coupled to the first node, a first electrode of the eighth transistor is configured to receive the composite output signal, and a second electrode of the eighth transistor is configured to be coupled to the shift signal output terminal; a gate of the ninth transistor is configured to be coupled to the first node, a first electrode of the ninth transistor is configured to receive the composite output signal, and a second electrode of the ninth transistor is configured to be coupled to the pixel signal output terminal; and a first electrode of the second capacitor is configured to be coupled to the first node, and a second electrode of the second capacitor is configured to be coupled to the second electrode of the eighth transistor.

For example, in the shift register unit provided in some embodiments of the present disclosure, the first electrode of the eighth transistor is coupled to a fourth clock signal terminal to receive a fourth clock signal as the composite output signal, and the first electrode of the ninth transistor is coupled to the fourth clock signal terminal a to receive the fourth clock signal as the composite output signal.

For example, in the shift register unit provided in some embodiments of the present disclosure, the noise reduction circuit includes a tenth transistor, an eleventh transistor, and a twelfth transistor; a gate of the tenth transistor is configured to be coupled to the second node, a first electrode of the tenth transistor is configured to be coupled to the first node, and a second electrode of the tenth transistor is configured to be coupled to a first voltage terminal to receive a first voltage; a gate of the eleventh transistor is configured to be coupled to the second node, a first electrode of the eleventh transistor is configured to be coupled to the shift signal output terminal, and a second electrode of the eleventh transistor is configured to be coupled to the first voltage terminal to receive the first voltage; a gate of the twelfth transistor is configured to be coupled to the second node, a first electrode of the twelfth transistor is configured to be coupled to the pixel signal output terminal, and a second electrode of the twelfth transistor is configured to be coupled to a third voltage terminal to receive a third voltage.

For example, in the shift register unit provided in some embodiments of the present disclosure, the first control circuit includes a thirteenth transistor, a fourteenth transistor and a fifteenth transistor; a gate of the thirteenth transistor is coupled to the first electrode and configured to be coupled to a fourth voltage terminal to receive a fourth voltage, and a second electrode of the thirteenth transistor is configured to be coupled to the second node; a gate of the fourteenth transistor is coupled to the first electrode and configured to be coupled to a fifth voltage terminal to receive a fifth voltage, and a second electrode of the fourteenth transistor is configured to be coupled to the second node; a gate of the fifteenth transistor is configured to be coupled to the first node, a first electrode of the fifteenth transistor is configured to be coupled to the second node, and a second electrode of the fifteenth transistor is configured to be coupled to a first voltage terminal to receive a first voltage.

For example, the shift register unit provided in some embodiments of the present disclosure further includes a blanking reset circuit, and the blanking reset circuit is configured to reset the first node in response to a blanking reset signal.

For example, in the shift register unit provided in some embodiments of the present disclosure, the blanking reset circuit includes a sixteenth transistor; a gate of the sixteenth transistor is configured to receive the blanking reset signal, a first electrode of the sixteenth transistor is configured to be coupled to the first node, and a second electrode of the sixteenth transistor is configured to be coupled to a first voltage terminal to receive a first voltage.

For example, in the shift register unit provided in some embodiments of the present disclosure, the gate of the sixteenth transistor is coupled to a second clock signal terminal to receive a second clock signal as the blanking reset signal.

For example, the shift register unit provided in some embodiments of the present disclosure further includes a display reset circuit, and the display reset circuit is configured to reset the first node in response to a display reset signal.

For example, in the shift register unit provided in some embodiments of the present disclosure, the display reset circuit includes a seventeenth transistor; a gate of the seventeenth transistor is configured to be coupled to a display reset signal terminal to receive the display reset signal, a first electrode of the seventeenth transistor is configured to be coupled to the first node, and a second electrode of the seventeenth transistor is configured to be coupled to a first voltage terminal to receive a first voltage.

At least one embodiment of the present disclosure further provides a shift register unit includes a blanking input circuit, a display input circuit, an output circuit, a first control circuit and a third control circuit, the blanking input circuit is configured to input a blanking pull-up signal to a first node in a blanking period of one frame according to a blanking input signal; the display input circuit is configured to input a display pull-up signal to the first node in a display period of one frame in response to a display input signal; the output circuit is configured to output a composite output signal to an output terminal under the control of a level of the first node; the first control circuit is configured to control a level of a second node under the control of the level of the first node; and the third control circuit is configured to control the level of the second node in response to a display pull-down control signal.

At least one embodiment of the present disclosure further provides a gate driving circuit including the shift register unit as claimed in any one of embodiments of the present disclosure.

For example, the gate driving circuit provided in some embodiments of the present disclosure further includes a first sub-clock signal line, a second sub-clock signal line, a third sub-clock signal line, and a fourth sub-clock signal line; in case the shift register unit includes a fourth clock signal terminal, the fourth clock signal terminal of the shift register unit of the $(4n-3)^{th}$ stage is coupled to the first sub-clock signal line; the fourth clock signal terminal of the shift register unit of the $(4n-2)^{th}$ stage is coupled to the second sub-clock signal line; the fourth clock signal terminal of the shift register unit of the $(4n-1)^{th}$ stage is coupled to the third sub-clock signal line; the fourth clock signal terminal of the shift register unit of the $(4n)^{th}$ stage is coupled to the fourth sub-clock signal line; and n is an integer greater than 0.

For example, the gate driving circuit provided in some embodiments of the present disclosure further includes a fifth sub-clock signal line and a sixth sub-clock signal line; in case that the shift register unit includes a second clock signal terminal and a third clock signal terminal, the second clock signal terminal of the shift register unit of the $(2m-1)^{th}$ stage is coupled to the fifth sub-clock signal line, and the third clock signal terminal of the shift register unit of the $(2m-1)^{th}$ stage is coupled to the sixth sub-clock signal line; the second clock signal terminal of the shift register unit of the $(2m)^{th}$ stage is coupled to the sixth sub-clock signal line, and the third clock signal terminal of the shift register unit of the $(2m)^{th}$ stage is coupled to the fifth sub-clock signal line; and m is an integer greater than 0.

For example, in the gate driving circuit provided in some embodiments of the present disclosure, in case that the shift register unit includes a blanking input signal terminal and a shift signal output terminal, the blanking input signal terminal of the shift register unit of the $(k+1)^{th}$ stage is coupled to the shift signal output terminal of the shift register unit of the $k^{th}$ stage, and k is an integer greater than 0.

For example, in the gate driving circuit provided in some embodiments of the present disclosure, in case that the shift register unit includes a display input signal terminal and a shift signal output terminal, the display input signal terminal of the shift register unit of the $(k+2)^{th}$ stage is coupled to the shift signal output terminal of the shift register unit of the $k^{th}$ stage, and k is an integer greater than 0.

At least one embodiment of the present disclosure further provides a display device including the gate driving circuit of any one of the embodiments of the present disclosure.

At least one embodiment of the present disclosure further provides a method of driving the shift register unit as claimed in any one of the embodiments of the present disclosure, in the display period of one frame, the method includes: a first pull-up stage, in which the display input circuit inputs the display pull-up signal to the first node in response to the display input signal; and a first output stage, in which the output circuit outputs the composite output signal to the output terminal under the control of the level of the first node; and in the blanking period of the frame, the method includes: a second pull-up stage, in which the blanking input circuit inputs the blanking pull-up signal to the first node according to the blanking input signal, and the second control circuit controls the level of the second node in response to the blanking pull-down control signal; and a second output stage, in which the output circuit outputs the composite output signal to the output terminal under the control of the level of the first node.

For example, in the method of driving the shift register unit provided in some embodiments of the present disclosure, in case that the shift register unit includes a third control circuit, the method further includes in the first pull-up stage, the third control circuit controls a level of the second node in response to a display pull-down control signal.

BRIEF DESCRIPTION OF THE DRAWINGS

In order to more clearly illustrate the technical solutions of the disclosure, the drawings of the embodiments are briefly introduced below, and obviously, the drawings in the following description relate to only some embodiments of the disclosure and do not limit the disclosure.

DETAILED DESCRIPTION

Figure 1A:
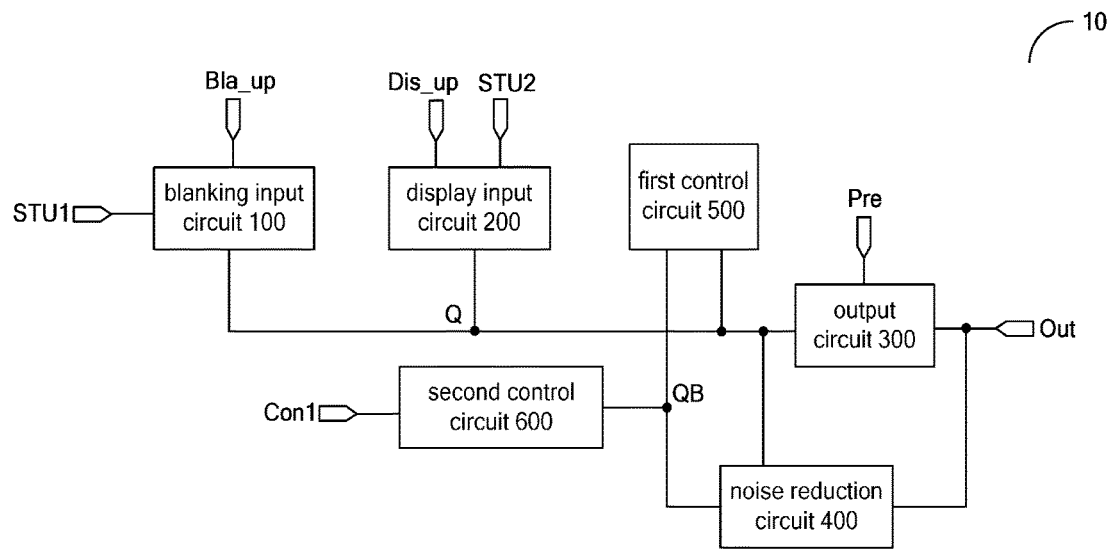
FIG. 1A is a schematic block diagram of a shift register unit according to some embodiments of the present disclosure.

In order to make the objects, technical solutions and advantages of the embodiments of the present disclosure more apparent, the technical solutions of the embodiments of the present disclosure will be described clearly and completely below with reference to the drawings of the embodiments of the present disclosure. It is to be understood that the described embodiments are some, but not all, embodiments of the present disclosure. All other embodiments, which can be derived by a person skilled in the art without inventive effort, based on the described embodiments of the present disclosure, are within the scope of the present disclosure.

Unless defined otherwise, technical or scientific terms used in the present disclosure should be construed as having a common meaning as understood by a person skilled in the art to which the present disclosure pertains. The use of "first", "second", and the like in this disclosure does not denote any order, quantity, or importance, but rather the terms "first", "second" and the like are used to distinguish one element from another. Likewise, the use of the terms "a", "an", or "the" do not denote a limitation of quantity, but rather denote the presence of at least one of the elements. The term "comprises" or "includes", and the like, means that an element or item preceding the word covers an element or item listed after the word and its equivalents, without excluding other elements or items. The terms "coupled" or "coupled" and the like, are not limited to physical or mechanical connections, but may include electrical connections, whether direct or indirect. The terms "upper", "lower", "left", "right", etc. are used only to indicate relative positional relationships, which may also change accordingly when the absolute position of the described object changes.

In an Organic Light Emitting Diode (OLED) display panel, a compensation method is required to improve display quality. When a sub-pixel unit in the OLED display panel is compensated, in addition to a pixel compensation circuit provided in the sub-pixel unit for internal compensation, external compensation may be performed by providing a sensing transistor. In performing the external compensation, a gate driving circuit constituted by shift register units needs to supply driving signals for a scanning transistor and a sensing transistor to the sub-pixel unit in the display panel, respectively. For example, in a display period (Display) of one frame, the gate driving circuit needs to supply a scanning driving signal (i.e., a display output signal) for the scanning transistor, and in a blank period (Blank) of one frame, the gate driving circuit needs to supply a sensing driving signal (i.e., a blank output signal) for the sensing transistor.

In the OLED display panel, a shift register unit of a gate driving circuit generally includes a sense unit, a display unit (for example, a scan unit), and a connection unit (or a gate circuit or Hiz circuit) that outputs a composite pulse of pulses from the sense unit and the scan unit. With the circuit configuration including the above three units, the shift register unit may output an output pulse of a composite waveform composed of two waveforms having different widths and timings, thereby providing a display output signal and a blank output signal to the scan transistor and the sense transistor, respectively. However, the shift register unit has a complicated circuit structure and a large size, which is not favorable for realizing high resolution and narrow frame, and is not favorable for reducing the chip area to reduce the cost.

In order to further reduce the size of the shift register unit and the gate driving circuit including the shift register unit, for example, the detection unit, the display unit, and the connection unit may be integrated such that the blanking output signal in the blanking period and the display output signal in the display period of one frame picture are output by a same output circuit, thereby simplifying the circuit configuration. However, in the integrated circuit, the threshold voltage of the transistor is easy to shift (for example, positive shift) after the transistor works for a long time, so that the output signal is easy to be affected, and the signal stability is poor.

At least one embodiment of the present disclosure provides a shift register unit, a driving method thereof, a gate driving circuit and a display device, and the shift register unit has a simple circuit structure, and can prevent a transistor, of which the threshold voltage shifts, from affecting an output signal, thereby enhancing reliability of the circuit.

Hereinafter, embodiments of the present disclosure will be described in detail with reference to the accompanying drawings. It should be noted that the same reference numerals in different figures will be used to refer to the same elements that have been described.

At least one embodiment of the present disclosure provides a shift register unit including a blanking input circuit, a display input circuit, an output circuit, a first control circuit, and a second control circuit. The blanking input circuit is configured to input a blanking pull-up signal to a first node in a blanking period of one frame according to a blanking input signal. The display input circuit is configured to input a display pull-up signal to the first node in a display period of the frame in response to a display input signal. The output circuit is configured to output a composite output signal to an output terminal under the control of a level of the first node. The first control circuit is configured to control a level of the second node under the control of the level of the first node. The second control circuit is configured to control the level of the second node in response to a blanking pull-down control signal.

FIG. 1A is a schematic block diagram of a shift register unit according to some embodiments of the present disclosure. Referring to FIG. 1A, the shift register unit 10 includes a blanking input circuit 100, a display input circuit 200, an output circuit 300, a first control circuit 500, and a second control circuit 600.

For example, the blanking input circuit 100 is configured to input a blanking pull-up signal to a first node Q in a blanking period of one frame according to a blanking input signal. For example, the blanking input circuit 100 is electrically coupled to a blanking input signal terminal STU1, a blanking pull-up signal terminal Bla_up, and the first node Q, and is configured to receive and store the blanking input signal supplied from the blanking input signal terminal STU1, and output the blanking pull-up signal supplied from the blanking pull-up signal terminal Bla_up to the first node Q according to the blanking input signal during a blanking period of the frame, thereby pulling up a potential of the first node Q to an operating potential.

For example, in one example, the blanking input circuit 100 may receive and store a blanking input signal in a display period of one frame, and output a blanking pull-up signal to the first node Q according to the stored blanking input signal in the blanking period of the frame, thereby pulling up the potential of the first node Q to an operating potential. For example, in another example, the blanking input circuit 100 may receive and store a blanking input signal in a blanking period of one frame, and output a blanking pull-up signal to the first node Q according to the stored blanking input signal in the blanking period of the next frame, thereby pulling up the potential of the first node Q to the operating potential.

For example, the display input circuit 200 is configured to input a display pull-up signal to the first node Q in response to a display input signal in a display period of one frame. For example, the display input circuit 200 is electrically coupled to a display input signal terminal STU2, a display pull-up signal terminal Dis_up, and the first node Q, and is configured to be turned on under control of the display input signal supplied from the display input signal terminal STU 2, electrically connect the display pull-up signal terminal Dis_up and the first node Q, thereby inputting the display pull-up signal supplied from the display pull-up signal terminal Dis_up to the first node Q, and pulling up the potential of the first node Q to the operating potential.

For example, the output circuit 300 is configured to output the composite output signal to the output terminal Out under control of the level of the first node Q. For example, the output circuit 300 is coupled to the first node Q, a composite output signal terminal Pre, and an output terminal Out, and is configured to be turned on under the control of the level of the first node Q, so that the composite output signal provided by the composite output signal terminal Pre is output to the output terminal Out. For example, an output signal of the output terminal Out may include a display output signal and a blanking output signal, and the display output signal and the blanking output signal may be two mutually independent waveforms having different widths and timings, that is, the widths and timings of the waveforms of the display output signal and the blanking output signal are different. For example, in a display period of one frame, the output circuit 300 outputs a display output signal via the output terminal Out under the control of the level of the first node Q to control a scan transistor in the pixel unit, thereby controlling the pixel unit to display. In the blanking period of one frame, the output circuit 300 outputs a blanking output signal via the output terminal Out under the control of the level of the first node Q to control the sensing transistor in the pixel unit, thereby performing compensation detection on the pixel unit.

For example, the first control circuit 500 is configured to control the level of the second node QB under the control of the level of the first node Q. For example, the first control circuit 500 is coupled to the first node Q and the second node QB, and configured to pull down the second node QB to a low level when the first node Q is at a high level and pull up the second node QB to a high level when the first node Q is at a low level. For example, the first control circuit 500 may be an inverter circuit.

For example, the second control circuit 600 is configured to control the level of the second node QB in response to the blanking pull-down control signal. For example, the second control circuit 600 is coupled to the second node QB and the blanking pull-down control terminal Con1, and is configured to be turned on under the control of the blanking pull-down control signal provided from the blanking pull-down control terminal Con1 during a blanking period of one frame, electrically connect the second node QB to a voltage terminal (e.g., a low voltage terminal), and thus pull down the second node QB to a non-operating potential.

In the case where the shift register unit does not include the second control circuit 600, threshold voltages of transistors in the respective circuits of the shift register unit are easily shifted, for example, positively shifted, after the shift register unit operates for a long time, and thus the high level written to the first node Q through the blanking input circuit 100 may be lower than a predetermined value, so that it is difficult to pull down the second node QB through the first control circuit 500, and the output signal of the output terminal Out may be further affected. The shift register unit 10 provided by the embodiment of the present disclosure includes a second control circuit 600, and the second control circuit 600 may pull down the second node QB in a blanking period of one frame to ensure that the second node QB is at a low level, which facilitates the blanking input circuit 100 to write a high level into the first node Q, so that the high level of the first node Q reaches a predetermined value, thereby preventing the threshold voltage shift of the transistors from affecting the output signal and enhancing the reliability of the circuit.

For example, in some examples, the first node Q is a pull-up node and the second node QB is a pull-down node. It should be noted that, in the embodiments of the present disclosure, for example, when each circuit is implemented as an N-type transistor, the term "pull-up" means that a node or an electrode of a transistor is charged such that the absolute value of the level of the node or the electrode is raised, thereby realizing the operation (e.g., conduction) of the corresponding transistor; "pull-down" means discharging a node or an electrode of a transistor such that the absolute value of the level of the node or the electrode is lowered, thereby realizing the operation (e.g., turning off) of the corresponding transistor. In an example, when each circuit is implemented as a P-type transistor, the term "pull-up" means discharging a node or an electrode of a transistor such that the absolute value of the level of the node or the electrode is lowered, thereby realizing the operation (e.g., turning on) of the corresponding transistor; "pull-down" means charging a node or an electrode of a transistor such that the absolute value of the level of the node or the electrode is raised, thereby realizing the operation (e.g., turning off) of the corresponding transistor.

For example, as shown in FIG. 1A, the shift register unit 10 further includes a noise reduction circuit 400. The noise reduction circuit 400 is configured to reduce noise of the first node Q and the output terminal Out under the control of the level of the second node QB. For example, the noise reduction circuit 400 is coupled to the second node QB, the first node Q, and the output terminal Out, and is configured to electrically connect the first node Q and the output terminal Out to a voltage terminal (e.g., a low voltage terminal) under the control of the level of the second node QB, and pull down the first node Q and the output terminal Out to a non-operating potential to achieve noise reduction.

Figure 2:
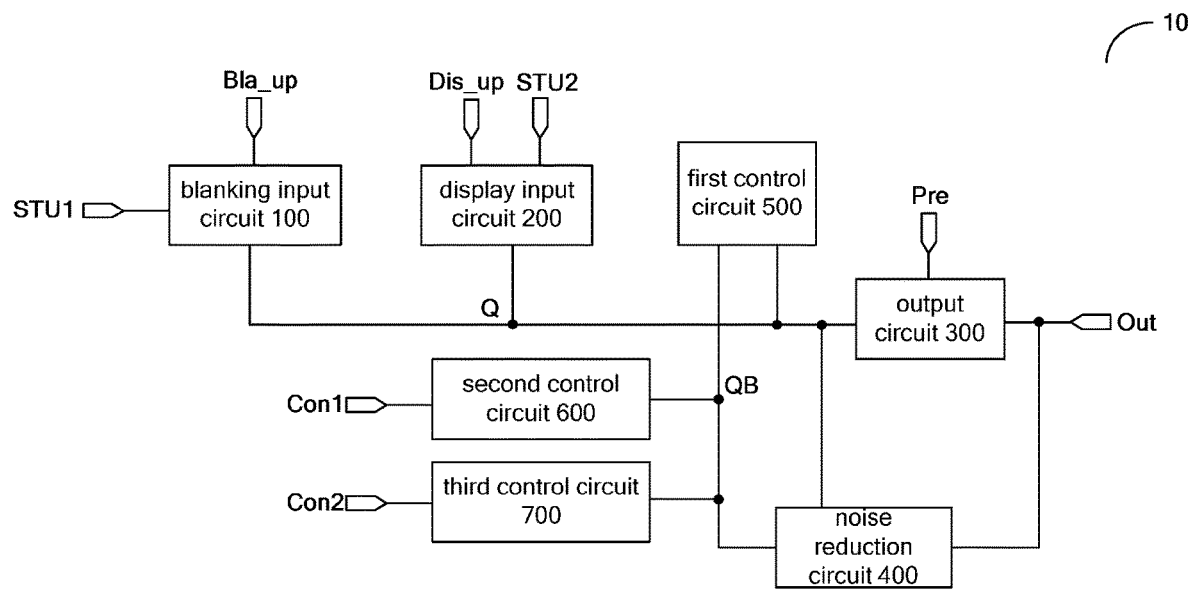
FIG. 2 is a schematic block diagram of yet another shift register unit according to some embodiments of the present disclosure.

FIG. 2 is a schematic block diagram of another shift register unit provided by some embodiments of the present disclosure. Referring to FIG. 2, the shift register unit 10 in this embodiment further includes a third control circuit 700, and other structures are substantially the same as the shift register unit 10 shown in FIG. 1A.

For example, the third control circuit 700 is configured to control the level of the second node QB in response to a display pull-down control signal. For example, the third control circuit 700 is coupled to the second node QB and a display pull-down control terminal Con2, and is configured to be turned on under the control of the display pull-down control signal provided from the display pull-down control terminal Con2 during a display period of one frame, electrically connect the second node QB to a voltage terminal (e.g., a low voltage terminal), and thereby pull down the second node QB to a non-operating potential.

In the case where the shift register unit does not include the third control circuit 700, the threshold voltages of the transistors in the respective circuits of the shift register unit are easily shifted, for example, shifted positively after the shift register unit operates for a long time, and thus the high level written to the first node Q through the display input circuit 200 may be lower than a predetermined value, so that it is difficult to pull down the second node QB through the first control circuit 500, and the output signal of the output terminal Out may be further affected. The shift register unit 10 provided by the embodiment of the present disclosure includes the third control circuit 700, which can pull down the second node QB in the display period of the frame to ensure that the second node QB is at a low level, and facilitate the display input circuit 200 to write a high level into the first node Q to make the high level of the first node Q reach a predetermined value, so that the shift of the threshold voltage of the transistor can be prevented from affecting the output signal, and the reliability of the circuit is enhanced.

Figure 1B:
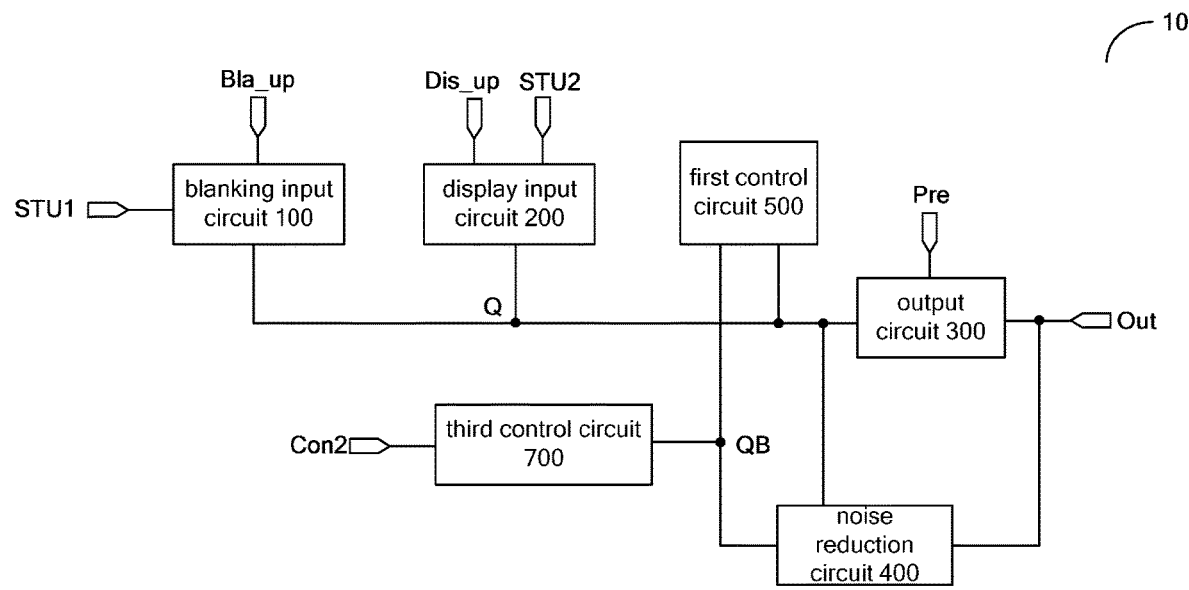
FIG. 1B is a schematic block diagram of another shift register unit according to some embodiments of the present disclosure.

FIG. 1B is a schematic block diagram of another shift register unit provided in some embodiments of the present disclosure. Referring to FIG. 1B, in the present embodiment, the shift register unit 10 includes a blanking input circuit 100, a display input circuit 200, an output circuit 300, a first control circuit 500, and a third control circuit 700. The blanking input circuit 100 is configured to input a blanking pull-up signal to the first node Q in a blanking period of one frame according to a blanking input signal; the display input circuit 200 is configured to input a display pull-up signal to the first node Q in response to a display input signal in a display period of one frame; the output circuit 300 is configured to output a composite output signal to the output terminal Out under the control of the level of the first node Q; the first control circuit 500 is configured to control the level of the second node QB under the control of the level of the first node Q; the third control circuit 700 is configured to control the level of the second node QB in response to the display pull-down control signal. That is, in the embodiment shown in FIG. 1B, the shift register unit 10 may include only the third control circuit 700, not the second control circuit 600, compared to the case shown in FIGS. 1A and 2. In addition, as described above, the shift register unit can pull down the second node QB in the display period of one frame to ensure that the second node QB is at a low level, which helps the display input circuit 200 to write a high level into the first node Q to make the high level of the first node Q reach a predetermined value, thereby preventing the shift of the threshold voltage of the transistor from affecting the output signal and enhancing the reliability of the circuit.

Figure 3:
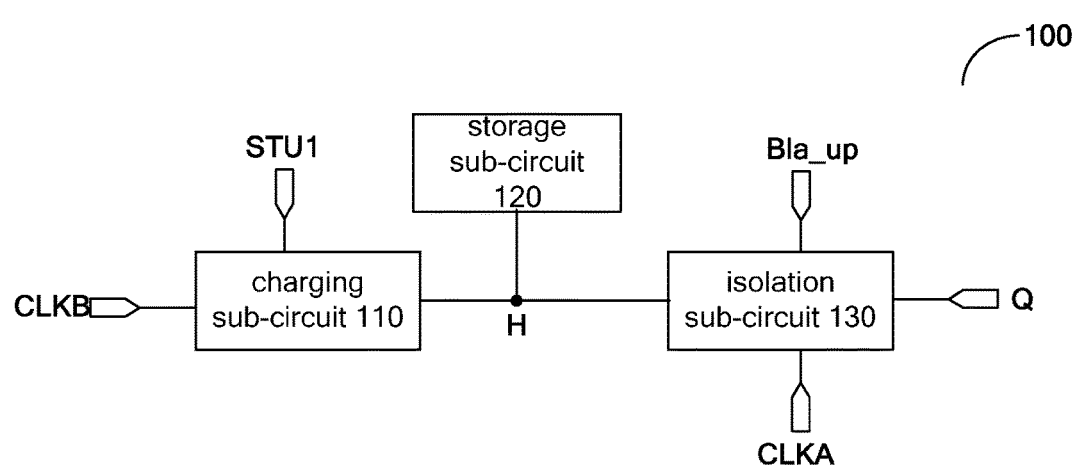
FIG. 3 is a schematic block diagram of a blanking input circuit of a shift register unit according to some embodiments of the present disclosure.

FIG. 3 is a schematic block diagram of a blanking input circuit of a shift register unit according to some embodiments of the present disclosure. Referring to FIG. 3, the blanking input circuit 100 includes a charging sub-circuit 110, a storage sub-circuit 120, and an isolation sub-circuit 130. The blanking input circuit 100 includes not only the blanking input signal terminal STU 1 and the blanking pull-up signal terminal Bla_up, but also a first clock signal terminal CLKA and a second clock signal terminal CLKB.

For example, the charging sub-circuit 110 is configured to input a blanking input signal to a control node H in response to a second clock signal. For example, the charging sub-circuit 110 is coupled to the blanking input signal terminal STU1, the second clock signal terminal CLKB, and the control node H, and is configured to be turned on under the control of the second clock signal provided from the second clock signal terminal CLKB, electrically connect the blanking input signal terminal STU1 and the control node H, and thereby write the blanking input signal into the control node H. For example, in one example, the charging sub-circuit 110 is turned on under the control of the second clock signal, and the blanking input signal is at a high level at this time to charge the control node H.

For example, the storage sub-circuit 120 is configured to store the blanking input signal input by the charging sub-circuit 110. For example, the storage sub-circuit 120 is coupled to the control node H and configured to store a blanking input signal written to the control node H.

For example, the isolation sub-circuit 130 is configured to input the blanking pull-up signal to the first node Q under the control of the level of the control node H and the first clock signal. For example, the isolation sub-circuit 130 is coupled to the control node H, the first node Q, the blanking pull-up signal terminal Bla_up, and the first clock signal terminal CLKA, and is configured to be turned on under the common control of the level of the control node H and the first clock signal provided from the first clock signal terminal CLKA, electrically connect the blanking pull-up signal terminal Bla_up and the first node Q, thereby inputting the blanking pull-up signal to the first node Q. For example, in an example, the isolation sub-circuit 130 is turned on under the common control of the level of the control node H and the first clock signal, and the blanking pull-up signal is at a high level at this time, and the first node Q may be charged.

It should be noted that in the embodiments of the present disclosure, the blanking input circuit 100 may include any applicable sub-circuit, and is not limited to the charging sub-circuit 110, the storage sub-circuit 120, and the isolation sub-circuit 130, as long as the corresponding functions can be implemented.

Figure 4A:
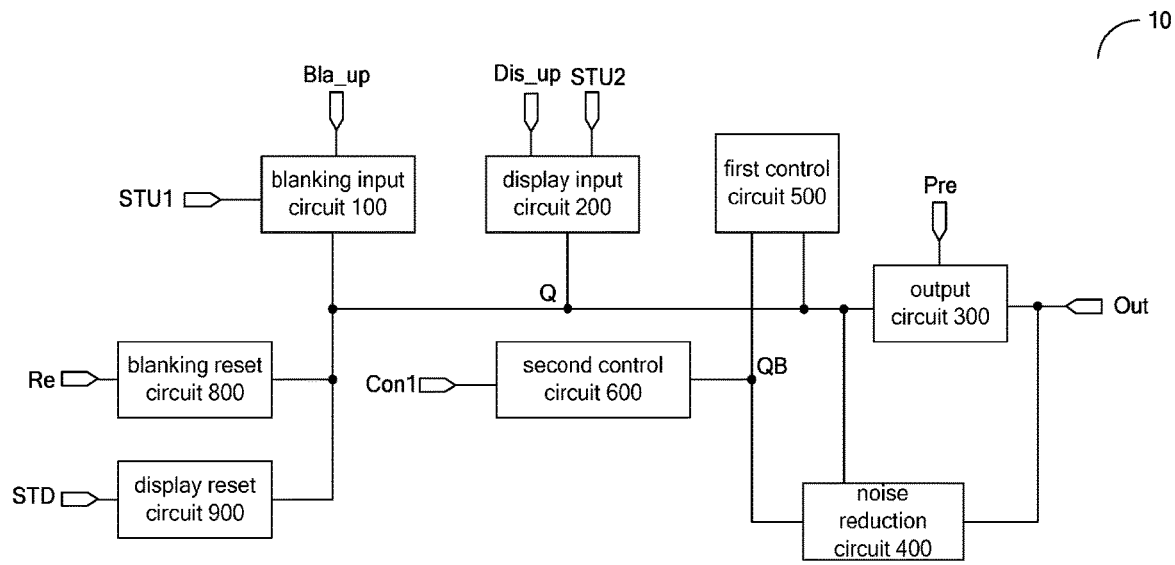
FIG. 4A is a schematic block diagram of a shift register unit according to another embodiment of the present disclosure.

FIG. 4A is a schematic block diagram of a shift register unit according to another embodiment of the present disclosure. Referring to FIG. 4A, the shift register unit 10 in this embodiment further includes a blanking reset circuit 800 and a display reset circuit 900, as compared to the shift register unit 10 described in FIG. 1A, and the other structures of the shift register unit 10 described in FIG. 4A are substantially the same as the shift register unit 10 described in FIG. 1A.

For example, the blanking reset circuit 800 is configured to reset the first node Q in response to a blanking reset signal. For example, the blanking reset circuit 800 is coupled to a blanking reset signal terminal Re and the first node Q, and is configured to be turned on under the control of a blanking reset signal provided from the blanking reset signal terminal Re, electrically connect the first node Q to a voltage terminal (e.g., a low voltage terminal), and thereby reset the first node Q. For example, in a blanking period of one frame, after the output circuit 300 completes the signal output, the first node Q is reset by the blanking reset circuit 800.

For example, the display reset circuit 900 is configured to reset the first node Q in response to a display reset signal. For example, the display reset circuit 900 is coupled to a display reset signal terminal STD and the first node Q, and is configured to be turned on under the control of a display reset signal provided from the display reset signal terminal STD, electrically connect the first node Q to a voltage terminal (e.g., a low voltage terminal), and thereby reset the first node Q. For example, in a display period of one frame, after the output circuit 300 completes the signal output, the first node Q is reset by the display reset circuit 900.

Figure 4B:
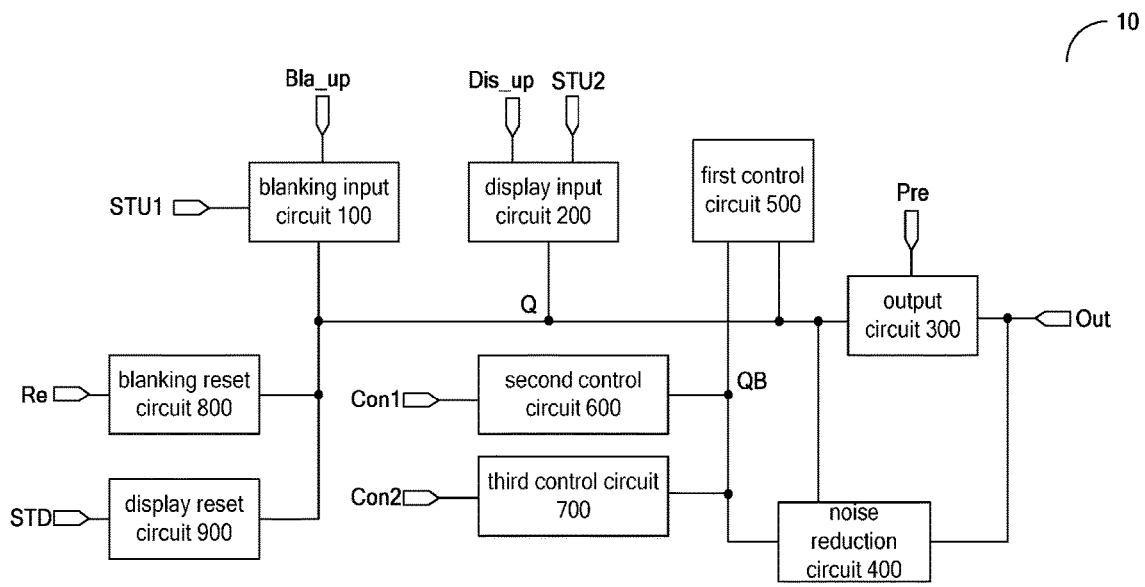
FIG. 4B is a schematic block diagram of another shift register unit according to another embodiment of the present disclosure.

FIG. 4B is a schematic block diagram of another shift register unit according to another embodiment of the present disclosure. Referring to FIG. 4B, the shift register unit 10 in this embodiment further includes a blanking reset circuit 800 and a display reset circuit 900, as compared to the shift register unit 10 described in FIG. 2, and the other structures of the shift register unit 10 described in FIG. 4B are substantially the same as the shift register unit 10 described in FIG. 2. In the embodiment shown in FIG. 4B, the blanking reset circuit 800 and the display reset circuit 900 are substantially the same as the blanking reset circuit 800 and the display reset circuit 900 described in FIG. 4A, and are not repeated herein.

Figure 4C:
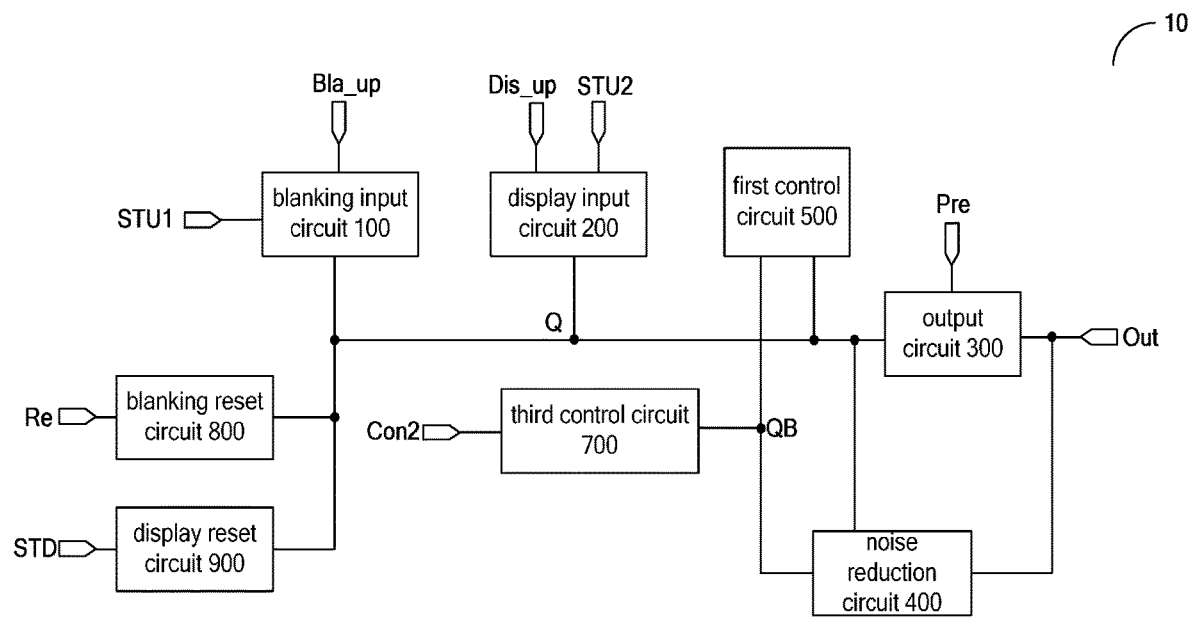
FIG. 4C is a schematic block diagram of another shift register unit according to another embodiment of the present disclosure.

Some embodiments of the present disclosure further provide a shift register unit, and FIG. 4C is a schematic block diagram of another shift register unit provided in another embodiment of the present disclosure. Referring to FIG. 4C, the shift register unit 10 in this embodiment further includes a blanking reset circuit 800 and a display reset circuit 900, as compared to the shift register unit 10 described in FIG. 1B, and the other structures of the shift register unit 10 described in FIG. 4C are substantially the same as the shift register unit 10 described in FIG. 1B. That is, in the embodiment shown in FIG. 4C, the shift register unit may include only the third control circuit 700, and not the second control circuit 600, compared to the case shown in FIGS. 4A and 4B, and the shift register unit may still achieve the corresponding technical effect. In the embodiment shown in FIG. 4C, the blanking reset circuit 800 and the display reset circuit 900 are substantially the same as the blanking reset circuit 800 and the display reset circuit 900 described in FIG. 4A, and are not described herein again.

Figure 5:
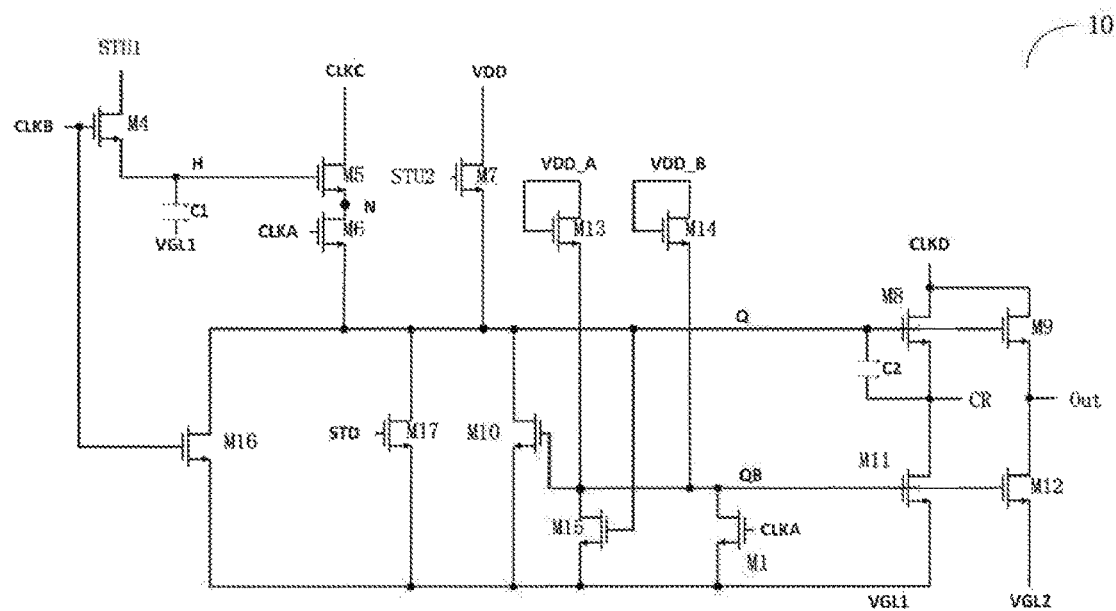
FIG. 5 is a circuit diagram of a specific implementation example of the shift register unit shown in FIG. 4A.

FIG. 5 is a circuit diagram of a specific implementation example of the shift register unit shown in FIG. 4A. In the following description, each transistor is an N-type transistor, but this does not limit the embodiments of the present disclosure.

Referring to FIG. 5, the shift register unit 10 includes a first transistor M1, fourth to seventeenth transistors M4 to M17, and further includes a first capacitor C1 and a second capacitor C2.

For example, the second control circuit 600 includes the first transistor M1, i.e., the second control circuit 600 may be implemented as the first transistor M1. The blanking pull-down control signal includes a first clock signal, i.e. in this example the first clock signal terminal CLKA for providing the first clock signal is equivalent to the previously described blanking pull-down control terminal Con1. A gate of the first transistor M1 is configured to be coupled to the first clock signal terminal CLKA to receive the first clock signal, a first electrode of the first transistor M1 is configured to be coupled to the second node QB, a second electrode of the first transistor M1 is configured to receive a first voltage of the first voltage terminal VGL1, for example, the second electrode of the first transistor M1 is directly coupled to the first voltage terminal VGL1. For example, the first voltage terminal VGL1 is configured to provide a DC low level signal (e.g., the level of the DC low level signal is lower than or equal to the low level of the clock signal), such as a ground, and the DC low level signal is referred to as a first voltage herein, which is the same as in the following embodiments and the description of which will be omitted.

For example, in a blanking period of one frame, when the first clock signal is at an active level (e.g., a high level), the first transistor M1 is turned on to electrically connect the second node QB to the first voltage terminal VGL1, thereby pulling down the second node QB to a low level.

For example, the blanking input circuit 100 includes a charging sub-circuit 110, a storage sub-circuit 120, and an isolation sub-circuit 130. The charging sub-circuit 110 includes a fourth transistor M4, i.e. the charging sub-circuit 110 may be implemented as the fourth transistor M4. A gate of the fourth transistor M4 is configured to be coupled to the second clock signal terminal CLKB to receive a second clock signal, a first electrode of the fourth transistor M4 is configured to be coupled to the blanking input signal terminal STU1 to receive the blanking input signal, and a second electrode of the fourth transistor M4 is configured to be coupled to the control node H. When the second clock signal is at an active level (e.g., high level), the fourth transistor M4 is turned on to electrically connect the blanking input signal terminal STU1 to the control node H, thereby writing the blanking input signal to the control node H. For example, the blanking input signal is at a high level at this time to charge the control node H.

For example, the memory sub-circuit 120 includes a first capacitor C1, i.e., the memory sub-circuit 120 may be implemented as the first capacitor C1. A first electrode of the first capacitor C1 is configured to be coupled to the control node H, and a second electrode of the first capacitor C1 is configured to be coupled to the first voltage terminal VGL1 to receive the first voltage. When the blanking input signal is written to the control node H, the control node H is charged to a high level, and the first capacitor C1 stores the high level and maintains the control node H at the high level for use in a subsequent stage.

It should be noted that, in the embodiments of the present disclosure, the first capacitor C1 may be a capacitor device manufactured by a process, for example, the capacitor device is realized by manufacturing dedicated capacitor electrodes, and each electrode of the capacitor may be realized by a metal layer, a semiconductor layer (e.g., doped polysilicon), or the like, and the first capacitor C1 may also be a parasitic capacitance between the devices, and may be realized by a transistor itself, another device, and a line. The connection manner of the first capacitor C1 is not limited to the above-described manner, and may be any other suitable connection manner as long as the level written to the control node H can be stored. For example, in other examples, a first electrode of the first capacitor C1 is coupled to the control node H, and a second electrode is coupled to a terminal of the isolation sub-circuit 130 (e.g., a third clock signal terminal CLKC described below); alternatively, the first electrode of the first capacitor C1 is coupled to the control node H, and the second electrode is coupled to a position in the isolation sub-circuit 130 (for example, a connection point N between a fifth transistor M5 and a sixth transistor M6 described below).

For example, the isolation sub-circuit 130 includes a fifth transistor M5 and a sixth transistor M6, i.e., the isolation sub-circuit 130 may be implemented as the fifth transistor M5 and the sixth transistor M6. A gate of the fifth transistor M5 is configured to be coupled to the control node H, a first electrode of the fifth transistor M5 is configured to receive the blanking pull-up signal, and a second electrode of the fifth transistor M5 is configured to be coupled to a first electrode of the sixth transistor M6. A gate of the sixth transistor M6 is configured to be coupled to the first clock signal terminal CLKA to receive the first clock signal, and the second electrode of the sixth transistor M6 is configured to be coupled to the first node Q. When the control node H is at a high level and the first clock signal is at a high level, the fifth transistor M5 and the sixth transistor M6 are both turned on, so that the third clock signal terminal CLKC is electrically coupled to the first node Q, thereby writing the third clock signal to the first node Q and pulling up the potential of the first node Q to the operating potential.

For example, in some examples, the first electrode of the fifth transistor M5 and the third clock signal terminal CLKC are coupled to receive a third clock signal as the blanking pull-up signal, i.e., herein, the third clock signal terminal CLKC functions as the blanking pull-up signal terminal Bla_up.

For example, the display input circuit 200 includes a seventh transistor M7, i.e., the display input circuit 200 may be implemented as the seventh transistor M7. A gate of the seventh transistor M7 is configured to be coupled to the display input signal terminal STU2 to receive a display input signal, a first electrode of the seventh transistor M7 is configured to receive a display pull-up signal, and a second electrode of the seventh transistor M7 is configured to be coupled to the first node Q. For example, the second voltage terminal VDD is configured to provide a DC high signal (e.g., the level of the DC high signal is higher than or equal to the high level of the clock signal), and the DC high signal is referred to as a second voltage, which is the same as in the following embodiments and the description of which will be omitted.

For example, the first electrode of the seventh transistor M7 and the second voltage terminal VDD are coupled to receive the second voltage as the display pull-up signal.

For example, when the display input signal is at an active level (e.g., high level), the seventh transistor M7 is turned on to electrically connect the second voltage terminal VDD to the first node Q, thereby writing the second voltage into the first node Q and pulling up the potential of the first node Q to the operating potential.

For example, in an example, the output circuit 300 includes at least one shift signal output terminal CR and at least one pixel signal output terminal Out (e.g., the output terminal Out described above) to improve the driving capability of the shift register unit 10. The shift signal output terminal CR is used for providing a blanking input signal for the next stage shift register unit 10, and the pixel signal output terminal Out is used for providing a driving signal for the pixel circuit. For example, the output signal of the shift signal output terminal CR is the same as the output signal of the pixel signal output terminal Out.

For example, the output circuit 300 includes an eighth transistor M8, a ninth transistor M9, and a second capacitor C2, i.e., the output circuit 300 can be implemented as the eighth transistor M8, the ninth transistor M9, and the second capacitor C2. A gate of the eighth transistor M8 is configured to be coupled to the first node Q, a first electrode of the eighth transistor M8 is configured to receive the composite output signal, and a second electrode of the eighth transistor M8 is configured to be coupled to the shift signal output terminal CR. A gate of the ninth transistor M9 is configured to be coupled to the first node Q, a first electrode of the ninth transistor M9 is configured to receive the composite output signal, and a second electrode of the ninth transistor M9 is configured to be coupled to the pixel signal output terminal Out. A first electrode of the second capacitor C2 is configured to be coupled to the first node Q, and a second electrode of the second capacitor C2 is configured to be electrically coupled to the second electrode of the eighth transistor M8 (or the second electrode of the ninth transistor M9). When the first node Q is at an operating potential (e.g., high level), the eighth transistor M8 and the ninth transistor M9 are both turned on, thereby outputting the composite output signal to the shift signal output terminal CR and the pixel signal output terminal Out.

For example, the first electrode of the eighth transistor M8 is coupled to a fourth clock signal terminal CLKD to receive a fourth clock signal as the composite output signal, and the first electrode of the ninth transistor M9 is also coupled to the fourth clock signal terminal CLKD to receive the fourth clock signal as the composite output signal, that is, the fourth clock signal terminal CLKD is eto the composite output signal terminal Pre described above.

It should be noted that, in each embodiment of the present disclosure, the second capacitor C2 may be a capacitor device manufactured by a process, for example, a capacitor device is realized by manufacturing dedicated capacitor electrodes, and each electrode of the capacitor may be realized by a metal layer, a semiconductor layer (e.g., doped polysilicon), or the like, and the second capacitor C2 may also be a parasitic capacitance between transistors, and may be realized by the transistor itself, other devices, and lines, as long as the level of the first node Q can be maintained and a bootstrap effect is realized when the signal is output at the shift signal output terminal CR or the pixel signal output terminal Out.

For example, the noise reduction circuit 100 may include a tenth transistor M10, an eleventh transistor M11, and a twelfth transistor M12, i.e., the noise reduction circuit 400 may be implemented as the tenth transistor M10, the eleventh transistor M11, and the twelfth transistor M12. A gate of the tenth transistor M10 is configured to be coupled to the second node QB, a first electrode of the tenth transistor M10 is configured to be coupled to the first node Q, and a second electrode of the tenth transistor M10 is configured to be coupled to the first voltage terminal VGL1 to receive the first voltage. A gate of the eleventh transistor M11 is configured to be coupled to the second node QB, a first electrode of the eleventh transistor M11 is configured to be coupled to the shift signal output terminal CR, and a second electrode of the eleventh transistor M11 is configured to be coupled to the first voltage terminal VGL1 to receive the first voltage. A gate of the twelfth transistor M12 is configured to be coupled to the second node QB, a first electrode of the twelfth transistor M12 is configured to be coupled to the pixel signal output terminal Out, and a second electrode of the twelfth transistor M12 is configured to be coupled to the third voltage terminal VGL2 to receive the third voltage.

For example, the third voltage terminal VGL2 is configured to provide a DC low level signal (e.g., the level of the DC low level signal is lower than or equal to the low level of the clock signal), for example, the DC low level signal is referred to as the third voltage, and the following embodiments are the same as these embodiments and will not be described again. For example, in one example, the third voltage of the third voltage terminal VGL2 is higher than the first voltage of the first voltage terminal VGL1; in another example, the third voltage of the third voltage terminal VGL2 is equal to the first voltage of the first voltage terminal VGL1. The third voltage and the first voltage may be the same or different, which may be determined according to actual requirements.

For example, when the second node QB is at an active level (e.g., a high level), the tenth transistor M10, the eleventh transistor M11, and the twelfth transistor M12 are all turned on, the first node Q and the shift signal output terminal CR are electrically coupled to the first voltage terminal VGL1, and the pixel signal output terminal Out is electrically coupled to the second voltage terminal VGL2, thereby reducing noise of the first node Q, the shift signal output terminal CR, and the pixel signal output terminal Out. It should be noted that, in each embodiment of the present disclosure, when the number of the shift signal output terminals CR and/or the number of the pixel signal output terminals Out are plural, the noise reduction circuit 400 also includes a plurality of transistors correspondingly coupled to the shift signal output terminals CR and/or the pixel signal output terminals Out, so as to reduce the noise of the plurality of shift signal output terminals CR and/or the pixel signal output terminals Out.

For example, the first control circuit 500 may include a thirteenth transistor M13, a fourteenth transistor M14, and a fifteenth transistor M15, i.e., the first control circuit 500 may be implemented as the thirteenth transistor M13, the fourteenth transistor M14, and the fifteenth transistor M15. A gate of the thirteenth transistor M13 is coupled to a first electrode of the thirteenth transistor M13 and configured to be coupled to a fourth voltage terminal VDD_A to receive a fourth voltage, and a second electrode of the thirteenth transistor M13 is configured to be coupled to the second node QB. A gate and a first electrode of the fourteenth transistor M14 are coupled to each other and configured to be coupled to a fifth voltage terminal VDD_B to receive a fifth voltage, and a second electrode of the fourteenth transistor M14 is configured to be coupled to the second node QB. A gate of the fifteenth transistor M15 is configured to be coupled to the first node Q, a first electrode of the fifteenth transistor M15 is configured to be coupled to the second node QB, and a second electrode of the fifteenth transistor M15 is configured to be coupled to the first voltage terminal VGL1 to receive the first voltage.

For example, in one example, the fourth voltage terminal VDD_A is configured to provide a DC low level signal, and the fifth voltage terminal VDD_B is configured to provide a DC high level signal, so that the thirteenth transistor M13 is always turned off and the fourteenth transistor M14 is always turned on. For example, in another example, the fourth voltage terminal VDD_A and the fifth voltage terminal VDD_B are configured to alternately provide a DC high level signal, so that the thirteenth transistor M13 and the fourteenth transistor M14 are alternately turned on to avoid performance shift caused by long-term turning on of the transistors. For example, when the fourth voltage terminal VDD_A provides a high level signal, the fifth voltage terminal VDD_B provides a low level signal, and at this time, the thirteenth transistor M13 is turned on and the fourteenth transistor M14 is turned off; When the fifth voltage terminal VDD_B provides a high level signal, the fourth voltage terminal VDD_A provides a low level signal, and the fourteenth transistor M14 is turned on and the thirteenth transistor M13 is turned off. For example, the signal provided by the fourth voltage terminal VDD_A is referred to as the fourth voltage, and the signal provided by the fifth voltage terminal VDD_B is referred to as the fifth voltage, which are the same as those in the following embodiments, and are not repeated herein.

For example, when the first node Q is at an active level (e.g., high level), the fifteenth transistor M15 is turned on, and the potential of the second node QB can be pulled down to a low level by designing a proportional relationship of a channel width-to-length ratio of the fifteenth transistor M15 and the turned-on thirteenth transistor M13 or fourteenth transistor M14. When the first node Q is at a low level, the fifteenth transistor M15 is turned off, and at this time, if the thirteenth transistor M13 is turned on and the fourteenth transistor M14 is turned off, a high level signal provided by the fourth voltage terminal VDD_A is written into the second node QB through the thirteenth transistor M13 to pull up the potential of the second node QB to a high level; if the thirteenth transistor M13 is turned off and the fourteenth transistor M14 is turned on, a high level signal provided from the fifth voltage terminal VDD_B is written into the second node QB through the fourteenth transistor M14 to pull up the potential of the second node QB to a high level.

For example, the blanking reset circuit 800 may include a sixteenth transistor M16, i.e., the blanking reset circuit 800 may be implemented as the sixteenth transistor M16. A gate of the sixteenth transistor M16 is configured to receive the blanking reset signal, a first electrode of the sixteenth transistor M16 is configured to be coupled to the first node Q, and a second electrode of the sixteenth transistor M16 is configured to be coupled to the first voltage terminal VGL1 to receive the first voltage. For example, in a blanking period of one frame, when the second clock signal is at an active level (e.g., high level), the sixteenth transistor M16 is turned on to electrically connect the first node Q and the first voltage terminal VGL1, thereby resetting the first node Q.

For example, the gate of the sixteenth transistor M16 and the second clock signal terminal CLKB are coupled to receive the second clock signal as the blanking reset signal.

For example, the display reset circuit 900 may include a seventeenth transistor M17, i.e., the display reset circuit 900 may be implemented as the seventeenth transistor M17. A gate of the seventeenth transistor M17 is configured to be coupled to the display reset signal terminal STD to receive the display reset signal, a first electrode of the seventeenth transistor M17 is configured to be coupled to the first node Q, and a second electrode of the seventeenth transistor M17 is configured to be coupled to the first voltage terminal VGL1 to receive the first voltage. For example, in a display period of one frame, when the display reset signal is at an active level (e.g., a high level), the seventeenth transistor M17 is turned on to electrically connect the first node Q and the first voltage terminal VGL1, thereby resetting the first node Q.

For example, in one example, in the case where a plurality of shift register units 10 are cascaded, the shift signal output terminal CR of the $(n_0+2)^{th}$ stage shift register unit 10 is coupled to the display reset signal terminal STD of the $(n_0)^{th}$ stage shift register unit 10 so that the output signal of the shift signal output terminal CR of the $(n_0+2)^{th}$ stage shift register unit 10 as the display reset signal of the $(n_0)^{th}$ stage shift register unit 10. Here, $n_0$ is an integer greater than 0. Of course, the embodiment of the present disclosure is not limited thereto, and the display reset signal terminal STD may also be coupled to a signal line separately provided to receive the display reset signal.

It should be noted that, in each embodiment of the present disclosure, specific configurations of the blanking input circuit 100, the display input circuit 200, the output circuit 300, the noise reduction circuit 400, the first control circuit 500, the second control circuit 600, the blanking reset circuit 800, and the display reset circuit 900 are not limited to the above, and may be any applicable configuration, such as well known to those skilled in the art, as long as the corresponding functions are guaranteed.

Figure 6:
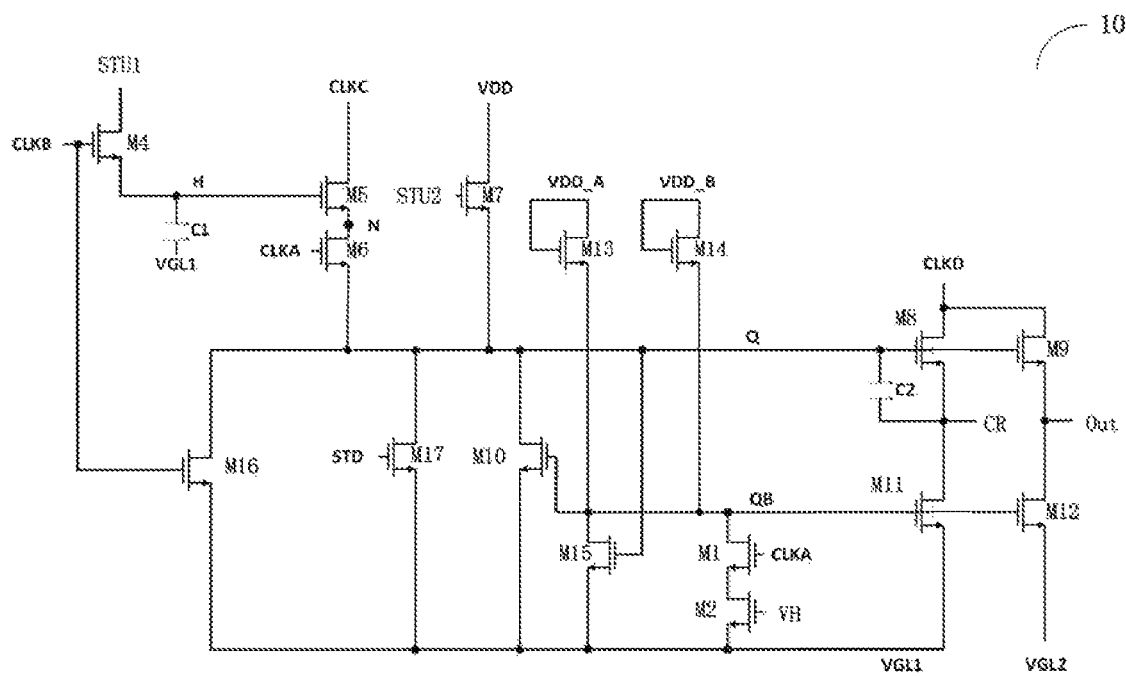
FIG. 6 is a circuit diagram of another specific implementation example of the shift register unit shown in FIG. 4A.

FIG. 6 is a circuit diagram of another specific example of the shift register unit shown in FIG. 4A. Referring to FIG. 6, the shift register unit 10 is substantially the same as the shift register unit 10 described in FIG. 5 except for the configuration of the second control circuit 600. In this embodiment, the second control circuit 600 may include a first transistor M1 and a second transistor M2 coupled in series with each other, i.e., the second control circuit 600 may be implemented as the first transistor M1 and the second transistor M2 coupled in series with each other. The blanking pull-down control signal includes a first clock signal provided by the first clock signal terminal CLKA and a first control signal provided by the first control signal terminal VH, i.e. in this example, the aforementioned blanking pull-down control terminal Con1 includes the first clock signal terminal CLKA and the first control signal terminal VH. A gate of the first transistor M1 is configured to be coupled to the first clock signal terminal CLKA to receive the first clock signal, and a first electrode of the first transistor M1 is configured to be coupled to the second node QB. A gate of the second transistor M2 is configured to be coupled to the first control signal terminal VH to receive the first control signal, a first electrode of the second transistor M2 is configured to be coupled to a second electrode of the first transistor M1, and a second electrode of the second transistor M2 is configured to be coupled to the first voltage terminal VGL1 to receive the first voltage. Other structures in the circuit are substantially the same as the shift register unit 10 described in FIG. 5, and are not described herein again.

In the blanking period of one frame, when both the first control signal and the first clock signal each are at an active level (e.g., high level), both the first transistor M1 and the second transistor M2 are turned on, electrically connecting the second node QB to the first voltage terminal VGL1, thereby pulling down the second node QB to a low level.

For example, in the case where a plurality of shift register units 10 are cascaded, when a certain row of shift register unit 10 outputs, the first control signal terminal VH of the shift register unit 10 of the row is caused to supply a high level signal, and the first control signal terminal VH of the shift register unit 10 located in any other row is caused to supply a low level signal, so that the second node QB of the shift register unit 10 of the row is pulled down, and the second node QB of the shift register unit 10 located in any other row is not pulled down, so as to avoid that the shift signal output terminal CR and the pixel signal output terminal Out of the shift register unit 10 located in any other row each are in a floating state, thereby reducing noise of the shift signal output terminal CR and the pixel signal output terminal Out.

For example, in one example, the first control signal terminal VH is coupled to the control node H, and a level of the control node H is used as the first control signal, which can simplify the circuit configuration. Of course, the embodiment of the present disclosure is not limited thereto, and the first control signal terminal VH may be coupled to a signal line provided separately.

Figure 7:
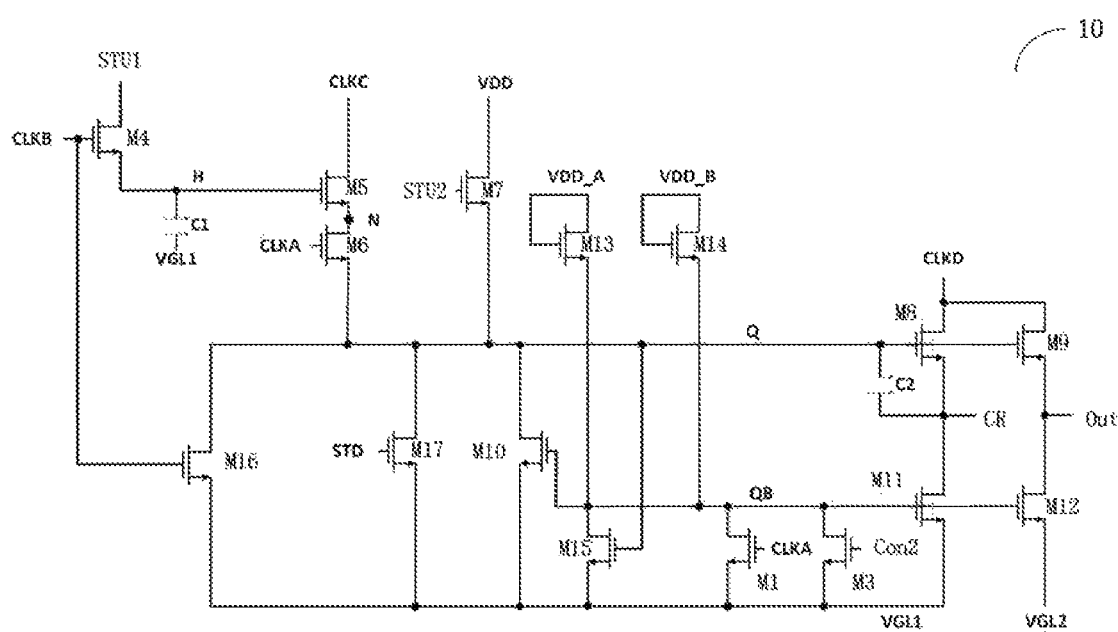
FIG. 7 is a circuit diagram of a specific implementation example of the shift register unit shown in FIG. 4B.

FIG. 7 is a circuit diagram of a specific example of the shift register unit shown in FIG. 4B. Referring to FIG. 7, the shift register unit 10 of this embodiment is substantially the same as the shift register unit 10 described in FIG. 5, except that the shift register unit 10 of this embodiment further includes a third transistor M3. In this embodiment, the shift register unit 10 includes a third control circuit 700.

For example, the third control circuit 700 may include the third transistor M3, i.e., the third control circuit 700 may be implemented as the third transistor M3. A gate of the third transistor M3 is configured to be coupled to the display pull-down control signal terminal Con2 to receive a display pull-down control signal, a first electrode of the third transistor M3 is configured to be coupled to the second node QB, and a second electrode of the third transistor M3 is configured to be coupled to the first voltage terminal VGL1 to receive a first voltage. Other structures in the circuit are substantially the same as the shift register unit 10 described in FIG. 5, and are not described herein again.

In the display period of one frame, when the display pull-down control signal is at an active level (e.g., high level), the third transistor M3 is turned on to electrically connect the second node QB to the first voltage terminal VGL1, thereby pulling down the second node QB to a low level.

For example, in one example, in the case where a plurality of shift register units 10 are cascaded, the shift signal output terminal CR of the shift register unit 10 of the $(m_0-2)^{th}$ stage is coupled to the display pull-down control signal terminal Con2 of the shift register unit 10 of the $(m_0)^{th}$ stage to use the output signal of the shift signal output terminal CR of the shift register unit 10 of the $(m_0-2)^{th}$ stage as the display pull-down control signal of the shift register unit 10 of the $(m_0)^{th}$ stage. Here, $m_0$ is an integer greater than 2. Of course, the embodiment of the present disclosure is not limited thereto, and the display pull-down control signal terminal Con2 may be coupled to a signal line separately provided.

It should be noted that, in the embodiments of the present disclosure, the specific configuration of the third control circuit 700 is not limited to the above, and may be any suitable configuration, such as well known to those skilled in the art, and as long as the corresponding function is implemented.

Figure 8:
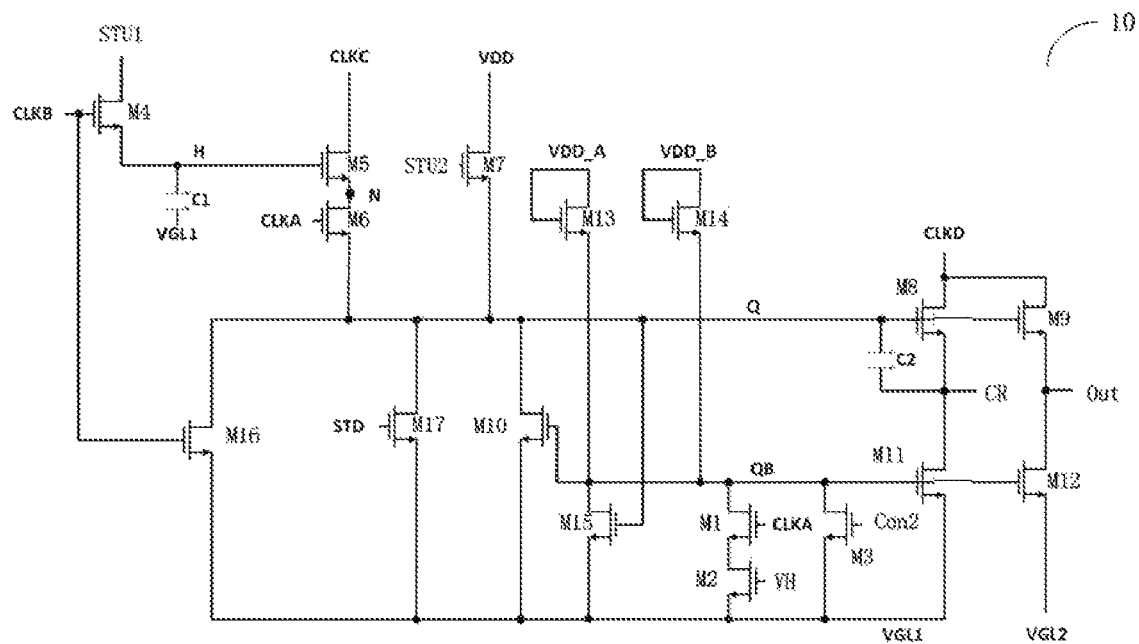
FIG. 8 is a circuit diagram of another specific implementation example of the shift register unit shown in FIG. 4B.

FIG. 8 is a circuit diagram of another specific example of the shift register unit shown in FIG. 4B. Referring to FIG. 8, the second control circuit 600 may include a first transistor M1 and a second transistor M2 coupled in series with each other, that is, the second control circuit 600 may be implemented as the first transistor M1 and the second transistor M2 coupled in series with each other, and the first transistor M1 and the second transistor M2 are coupled in substantially the same manner as the shift register unit 10 described in FIG. 6; the third control circuit 700 may include a third transistor M3, i.e., the third control circuit 700 may be implemented as the third transistor M3, the third transistor M3 being coupled in substantially the same manner as the shift register unit 10 described in FIG. 7. The specific structure of the circuit may be referred to the above description about the shift register unit 10, and is not described herein again.

Figure 9:
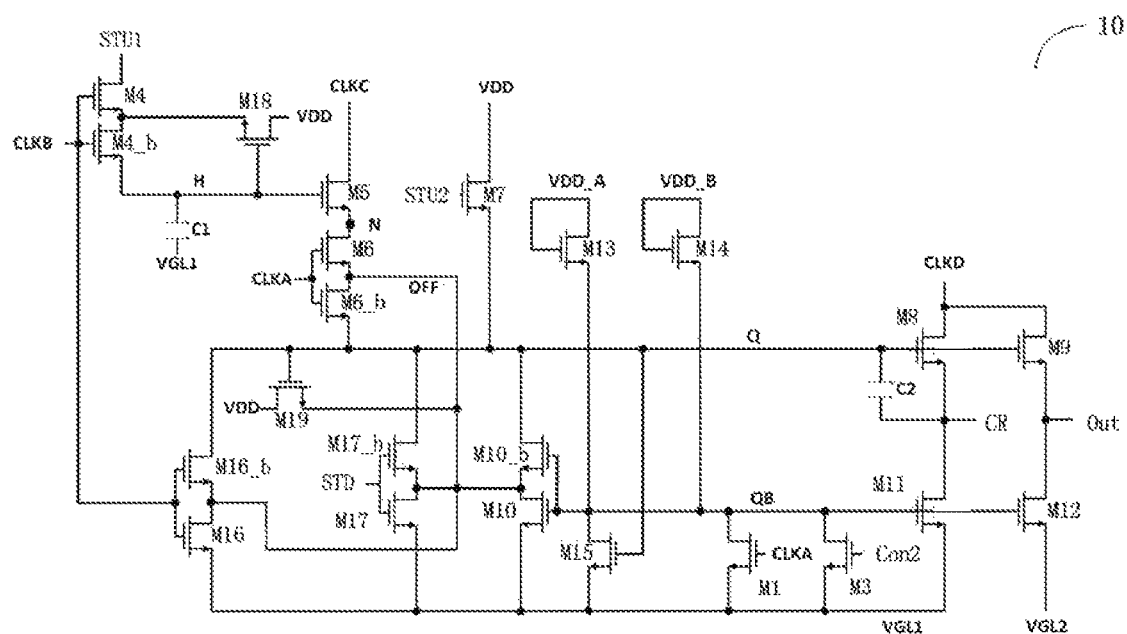
FIG. 9 is a circuit diagram of yet another specific implementation example of the shift register unit shown in FIG. 4B.

FIG. 9 is a circuit diagram of still another specific example of the shift register unit shown in FIG. 4B. Referring to FIG. 9, the shift register unit 10 of this embodiment is substantially the same as the shift register unit 10 described in FIG. 7, except that a plurality of leakage preventing circuits are further included. In the shift register unit 10 shown in FIG. 7, the potential of the blanking control node H can be maintained by the first capacitor C1, and the potential of the first node Q can be maintained by the second capacitor C2. When the potential of the first node Q and/or the blanking control node H is maintained at a high level, there are some transistors whose first electrodes are coupled to the first node Q and/or the blanking control node H and whose second electrodes are coupled to a signal line of a low level. Even in the case of a non-conductive signal input to the gates of these transistors, a phenomenon of leakage may occur due to a voltage difference between the first and second electrodes thereof, thereby deteriorating the maintaining effect of the circuit on the potential of the first node Q and/or the blanking control node H. Therefore, the shift register unit 10 shown in FIG. 9 is added with the plurality of leakage preventing circuits to improve the maintaining effect on the potential of the first node Q and/or the blanking control node H.

Referring to FIG. 9, a first leakage prevention circuit may be implemented as a first leakage prevention transistor M4_b and a second leakage prevention transistor M18 and configured to prevent charges at the blanking control node H from leaking to the blanking input signal terminal STU1 via the fourth transistor M4 when the blanking control node H is at a high level. A gate of the first leakage prevention transistor M4_b is coupled to the gate of the fourth transistor M4, i.e., the gate of the first leakage prevention transistor M4_b is coupled to the second clock signal terminal CLKB, a first electrode of the first leakage prevention transistor M4_b is coupled to the second electrode of the fourth transistor M4, and a second electrode of the first leakage prevention transistor M4_b is coupled to the blanking control node H. A gate of the second leakage preventing transistor M18 is coupled to the blanking control node H, a first electrode of the second leakage preventing transistor M18 is coupled to the second voltage terminal VDD, and a second electrode of the second leakage preventing transistor M18 is coupled to the first electrode of the first leakage preventing transistor M4_b.

When the blanking control node H is at a high level, the second leakage preventing transistor M18 is turned on under the control of the blanking control node H and writes a second voltage (high voltage) to the first electrode of the first leakage preventing transistor M4_b, thereby making both the first electrode and the second electrode of the first leakage preventing transistor M4_b in a high level state to prevent charges at the blanking control node H from leaking through the first leakage preventing transistor M4_b. At this time, since the gate of the fourth transistor M4 is coupled to the gate of the first leakage prevention transistor M4_b, the combination of the first leakage prevention transistor M4_b and the fourth transistor M4 can realize the same function as the fourth transistor M4 and has the leakage prevention effect.

Similarly, for the sixth transistor M6, the tenth transistor M10, the sixteenth transistor M16, and the seventeenth transistor M17 coupled to the first node Q, the same leakage preventing circuit as the above may be employed to achieve the effect of leakage prevention. For example, the second leakage prevention circuit may be implemented as a third leakage prevention transistor M6_b, a fourth leakage prevention transistor M10_b, a fifth leakage prevention transistor M16_b, a sixth leakage prevention transistor M17_b, and a seventh leakage prevention transistor M19. The connection mode and the working principle of the second leakage prevention circuit are similar to those of the first leakage prevention circuit, and the description thereof is omitted here.

For example, when the first node Q is at a high level, the seventh leakage prevention transistor M19 is turned on to make a leakage prevention node OFF at a high level, so that the first and second electrodes of the third leakage prevention transistor M6_b, the fourth leakage prevention transistor M10_b, the fifth leakage prevention transistor M16_b, and the sixth leakage prevention transistor M17_b are all at a high level to prevent the charges at the first node Q from leaking. At this time, the combination of the sixth transistor M6, the tenth transistor M10, the sixteenth transistor M16, the seventeenth transistor M17 and the second leakage preventing circuit can realize the same functions as the sixth transistor M6, the tenth transistor M10, the sixteenth transistor M16, and the seventeenth transistor M17, and has a leakage preventing effect.

It should be noted that, as one skilled in the art can appreciate, according to the embodiment of the circuit with the preventing leakage function provided by the embodiments of the present disclosure, one or more transistors in the shift register unit 10 can be selected according to actual situations to be provided with the circuit structure of preventing leakage. FIG. 9 shows only one exemplary circuit structure including the leakage prevention circuit, and does not constitute a limitation to the embodiment of the present disclosure.

Figure 10:
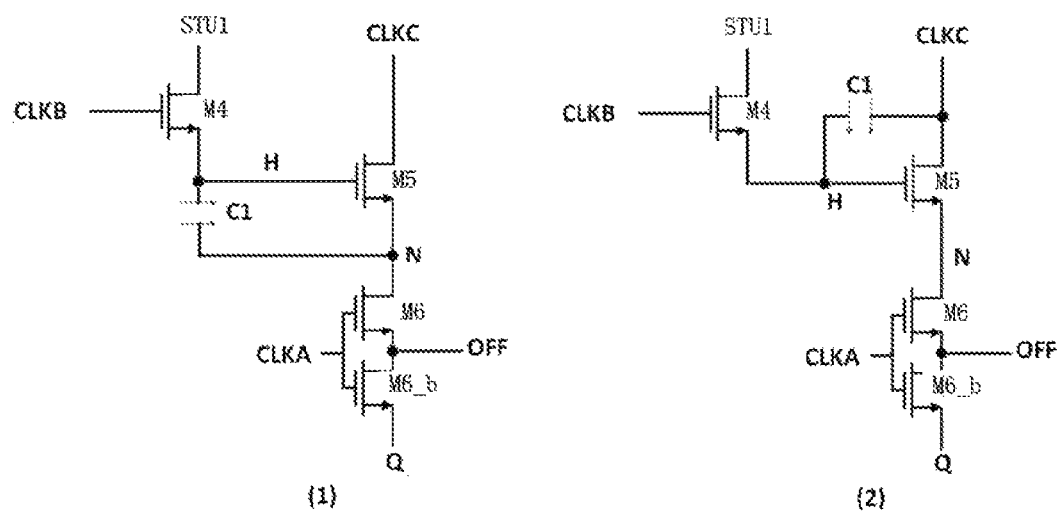
FIG. 10 is a circuit diagram of a specific implementation example of the blanking input circuit of the shift register unit shown in FIG. 9.

FIG. 10 is a circuit diagram of a specific example of the blanking input circuit of the shift register unit shown in FIG. 9. Referring to FIG. 10 (1), in one example, a first electrode of the first capacitor C1 is coupled to the control node H, and a second electrode of the first capacitor C1 is coupled to a connection point N between the fifth transistor M5 and the sixth transistor M6. Referring to FIG. 10 (2), in another example, a first electrode of the first capacitor C1 is coupled to the control node H, and a second electrode of the first capacitor C1 is coupled to the third clock signal terminal CLKC. Of course, the embodiment of the present disclosure is not limited thereto, and the first capacitor C1 may also adopt other conventional connection manners as long as the corresponding function can be realized. For example, the fourth transistor M4 may be combined with or not combined with a leakage prevention circuit structure, which does not affect the connection of the first capacitor C1. The connection of the other transistors in the circuit is substantially the same as the shift register unit 10 shown in FIG. 9, and is not described herein again.

Figure 11:
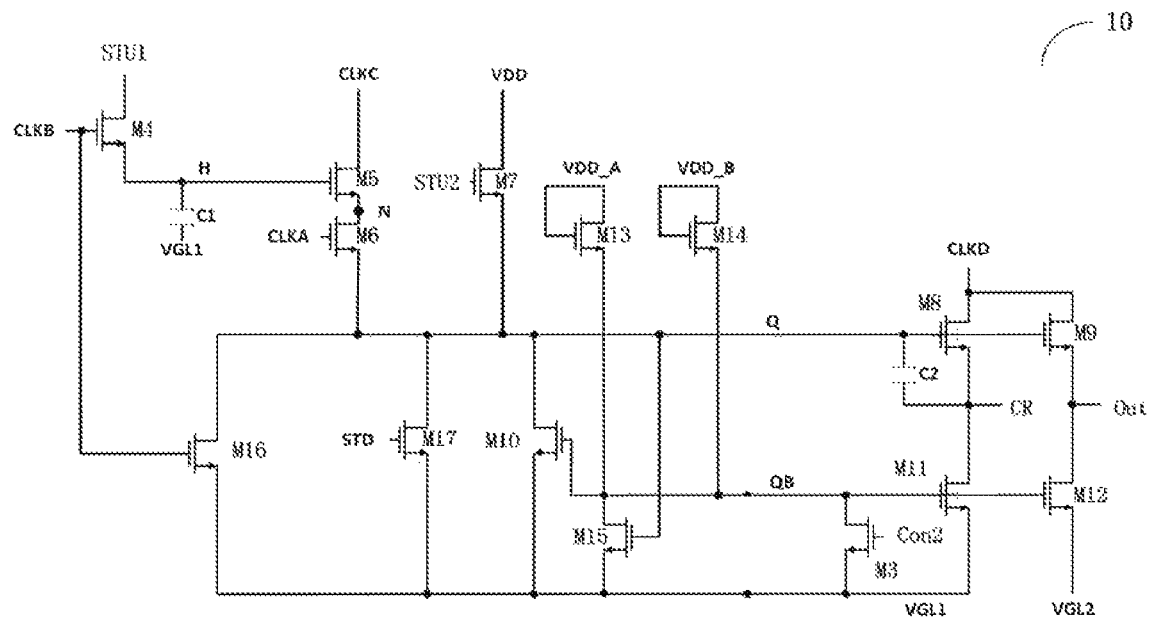
FIG. 11 is a circuit diagram of a specific implementation example of the shift register unit shown in FIG. 4C.

FIG. 11 is a circuit diagram of a specific example of the shift register unit shown in FIG. 4C. In the embodiment shown in FIG. 11, the shift register unit only includes the third control 700 and does not include the second control circuit 600. Referring to FIG. 11, the third control circuit 700 may include a third transistor M3, i.e., the third control circuit 700 may be implemented as the third transistor M3, and the third transistor M3 is coupled in substantially the same manner as the shift register unit 10 described in FIG. 7. The shift register unit 10 of the embodiment shown in FIG. 11 is substantially the same as the shift register unit 10 described in FIG. 7 except that the first transistor M1 is not included, and the specific structure of the shift register unit of the embodiment shown in FIG. 11 can be referred to the above descriptions about the fourth to seventeenth transistors M4 to M17, the first capacitor C1 and the second capacitor C2 of the shift register unit 10, which are not repeated herein.

It is to be noted that, in the description of the respective embodiments of the present disclosure, the first node Q, the second node QB, the control node H, and the leakage preventing node OFF do not represent members that actually exist, but represent junctions of related electrical connections in the circuit diagram.

It should be noted that the transistors used in the embodiments of the present disclosure may be thin film transistors, field effect transistors, or other switching devices with the same characteristics, and the embodiments of the present disclosure are all described by taking thin film transistors as examples. The source and drain of the transistor used herein may be symmetrical in structure, so that the source and drain thereof may be indistinguishable in structure. In the embodiments of the present disclosure, in order to distinguish two electrodes of the transistor except for the gate, it is directly described that one electrode is a first electrode and the other electrode is a second electrode.

In addition, each of the transistors in the embodiments of the present disclosure are all described by taking an N-type transistor as an example, and in this case, the first electrode of the transistor is a drain, and the second electrode of the transistor is a source. It should be noted that the present disclosure includes, but is not limited to, this. For example, one or more transistors in the shift register unit 10 provided by the embodiment of the present disclosure may also be P-type transistors, where the first electrode of the transistor is a source, and the second electrode of the transistor is a drain, and it is only necessary to connect the electrodes of the selected type of transistors with reference to the electrodes of the corresponding transistors in the embodiment of the present disclosure, and make the corresponding voltage terminal provide corresponding a high voltage or low voltage. When an N-type transistor is used, Indium Gallium Zinc Oxide (IGZO) may be used as an active layer of the thin film transistor, and the size of the transistor may be effectively reduced and leakage current may be prevented, as compared to the case in which Low Temperature Poly Silicon (LTPS) or amorphous Silicon (e.g., hydrogenated amorphous Silicon) is used as an active layer of the thin film transistor.

Figure 12:
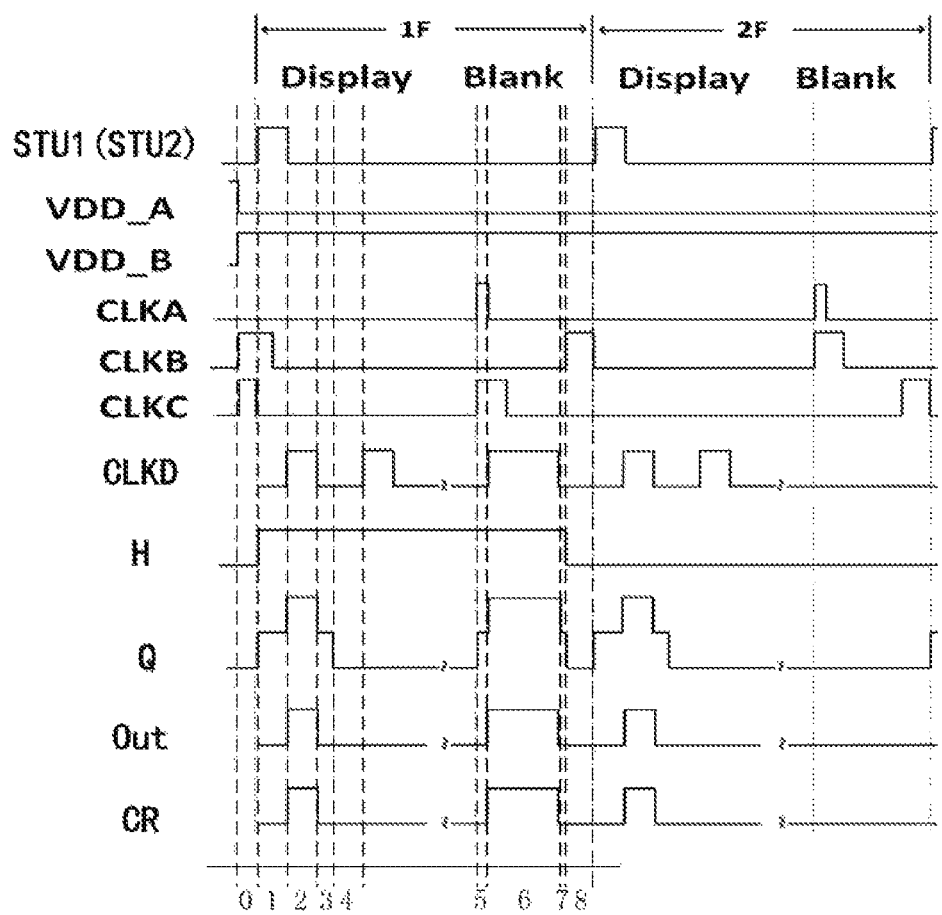
FIG. 12 is a timing diagram illustrating signals of a shift register unit according to some embodiments of the present disclosure.

FIG. 12 is a timing diagram illustrating signals of a shift register unit according to some embodiments of the present disclosure. The operation principle of the shift register unit 10 shown in FIG. 7 is explained below with reference to a signal timing chart shown in FIG. 12, and the example in which each transistor is an N-type transistor is explained here, but the embodiment of the present disclosure is not limited thereto.

In FIG. 12 and in the following description, 1F, 2F, 3F, and 4F denote timings of a first frame, a second frame, a third frame, and a fourth frame, respectively. Display denotes a display period of one frame, and Blank denotes a blanking period of one frame. STU1, STU2, VDD_A, VDD_B, CLKA, CLKB, CLKC, CLKD, Out, CR, etc. are used to represent both the respective signal terminals and the respective signals, which are the same as in the following embodiments and will not be described in detail.

In an initial stage 0, the second clock signal CLKB is at a high level, the sixteenth transistor M16 is turned on to reset the first node Q, the fourth transistor M4 is turned on, and the blanking input signal STU1 is at a low level, thereby resetting the control node H.

In the display period Display, in a first stage 1, the blanking input signal STU1, the display input signal STU2, and the fifth voltage VDD_B are all at a high level. The second clock signal CLKB is at a high level for a period of time in the first stage 1, at which time the fourth transistor M4 and the sixteenth transistor M16 are both turned on, the control node H is written high and stored in the first capacitor C1, when the second clock signal CLKB becomes low, the sixteenth transistor M16 is turned off, and since the seventh transistor M7 is turned on, the display pull-up signal (e.g., the display pull-up signal is a high signal) is written into the first node Q via the seventh transistor M7, so that the first node Q is written high. For example, the display input signal STU 2 is input to the display pull-down control terminal Con2 as a display pull-down signal, so that the third transistor M3 is turned on and the second node QB is pulled down to a low level. The fourteenth transistor M14 is also turned on, and since the level of the first node Q is high, the fifteenth transistor M15 is turned on, pulling down the second node QB to a low level.

For example, after the shift register unit works for a long time, the threshold voltages of the transistors in the circuits of the shift register unit are easy to shift, for example, positively shift, when the positive shift of the fifteenth transistor M15 is large, it is difficult to pull down the second node QB through the fifteenth transistor M15, and the second node QB can be pulled down quickly in the display period through the third transistor M3, so that the high-level writing capability of the first node Q is improved. The eighth transistor M8 and the ninth transistor M9 are turned on by the high level of the first node Q, and output the fourth clock signal CLKD to the shift signal output terminal CR and the pixel signal output terminal Out. Since the fourth clock signal CLKD is at a low level at this time, both the shift signal output terminal CR and the pixel signal output terminal Out output a low level. In the first stage 1, the first capacitor C1 stores a high level signal and remains until the end of the display period of one frame for use in the blanking period.

In a second stage 2, the first node Q is kept at a high level, and the eighth transistor M8 and the ninth transistor M9 are kept turned on. When the fourth clock signal CLKD changes to be at a high level, the shift signal output terminal CR and the pixel signal output terminal Out both output high level signals, the potential of the first node Q further rises due to the coupling action (or bootstrap action) of the second capacitor C2, the eighth transistor M8 and the ninth transistor M9 are fully turned on, and the high level of the fourth clock signal CLKD is output to the shift signal output terminal CR and the pixel signal output terminal Out.

In a third stage 3, the fourth clock signal CLKD changes to the low level, the potential of the first node Q is lowered but still remains at the high level due to the coupling of the second capacitor C2, the eighth transistor M8 and the ninth transistor M9 remain turned on, and the low level of the fourth clock signal CLKD is output to the shift signal output terminal CR and the pixel signal output terminal Out to complete the reset of the output signal.

In a fourth stage 4, the display reset signal STD (not shown) is at a high level, and the seventeenth transistor M17 is turned on, thereby resetting the first node Q to make the first node Q be at a low level. The fifteenth transistor M15 is turned off, and the second node QB is pulled up to a high level by the turned-on fourteenth transistor M14. The tenth transistor M10 is turned on by the high level of the second node QB to further reduce noise of the pull-up node Q. The eleventh transistor M11 and the twelfth transistor M12 are also turned on by the high level of the second node QB, thereby reducing noise of the shift signal output terminal CR and the pixel signal output terminal Out.

In the above-described respective stages, since the first clock signal CLKA is always kept at the low level, the sixth transistor M6 is in the turned-off state, thereby isolating the control node H from the first node Q to prevent the level of the control node H from affecting the output signal in the display period.

For example, as shown in FIG. 12, the level of the first node Q has a tower-like waveform, the pull-up and reset of the output signal of the shift signal output terminal CR are both implemented by the eighth transistor M8, the pull-up and reset of the output signal of the pixel signal output terminal Out are both implemented by the ninth transistor M9, and the eleventh transistor M11 and the twelfth transistor M12 play a role in assisting the pull-down of the output signals of the shift signal output terminal CR and the pixel signal output terminal Out, so that the volumes of the eleventh transistor M11 and the twelfth transistor M12 can be reduced, which is advantageous for reducing the area of the circuit layout.

In a blank period Blank, the first clock signal CLKA, the third clock signal CLKC, and the fifth voltage VDD_B are at a high level in a fifth stage 5. The control node H maintains at a high level written in the display period, and the fifth transistor M5 is turned on. The sixth transistor M6 is turned on by the high level of the first clock signal CLKA, so that the third clock signal CLKC is written into the first node Q sequentially through the fifth transistor M5 and the sixth transistor M6, and the first node Q is set to a high level. The first transistor M1 is turned on by the high level of the first clock signal CLKA, and pulls down the second node QB to a low level. The fourteenth transistor M14 is also turned on, and since the level of the first node Q is high, the fifteenth transistor M15 is turned on, pulling down the second node QB to a low level.

For example, after the shift register unit operates for a long time, the threshold voltages of the transistors in the circuits of the shift register unit are easy to shift, for example, positively shift, and when the positive shift of the fifteenth transistor M15 is large, it is difficult to pull down the second node QB through the fifteenth transistor M15, and the second node QB can be pulled down quickly in the blanking period through the first transistor M1, so that the high-level writing capability of the first node Q is improved. The eighth transistor M8 and the ninth transistor M9 are turned on by the high level of the first node Q, and output the fourth clock signal CLKD to the shift signal output terminal CR and the pixel signal output terminal Out. Since the fourth clock signal CLKD is at a low level at this time, both the shift signal output terminal CR and the pixel signal output terminal Out output a low level.

In a sixth stage 6, the first clock signal CLKA becomes at a low level, and the sixth transistor M6 is turned off, so that the first node Q does not leak through the sixth transistor M6. At this time, the first transistor M1 is also turned off. Since the first node Q is maintained at the high level, the eighth transistor M8 and the ninth transistor M9 are maintained to be turned on, when the fourth clock signal CLKD changes to a high level, the shift signal output terminal CR and the pixel signal output terminal Out both output the high level signal, the potential of the first node Q further rises due to the coupling action of the second capacitor C2, the eighth transistor M8 and the ninth transistor M9 are sufficiently turned on, and the high level of the fourth clock signal CLKD is output to the shift signal output terminal CR and the pixel signal output terminal Out.

In a seventh stage 7, the fourth clock signal CLKD changes to the low level, the potential of the first node Q is lowered but still remains at a high level due to the coupling of the second capacitor C2, the eighth transistor M8 and the ninth transistor M9 remain turned on, and the low level of the fourth clock signal CLKD is output to the shift signal output terminal CR and the pixel signal output terminal Out to complete the reset of the output signal.

In an eighth stage 8 (the end of the blank period Blank), the second clock signal CLKB is at a high level, and the fourth transistor M4 and the sixteenth transistor M16 are turned on, thereby resetting the control node H and the first node Q. This makes it possible to keep the control node H at a high level for a short time, thereby reducing the risk of threshold voltage shift (e.g., positive shift) of the transistor coupled to the control node H, and contributing to the improvement of the reliability of the circuit.

In this embodiment, the first transistor M1 may increase the high-level writing capability of the first node Q in the blanking period Blank, and the third transistor M3 may increase the high-level writing capability of the first node Q in the display period Display, so that the transistor threshold voltage in the circuit is prevented from shifting (e.g., positively shifting) to affect the output signal, and the reliability of the circuit is enhanced. In the timing of each frame, the first transistor M1 and the third transistor M3 each have a turn-on period during which a positive shift phenomenon of the transistor coupled to the second node QB can be relieved.

Figure 13:
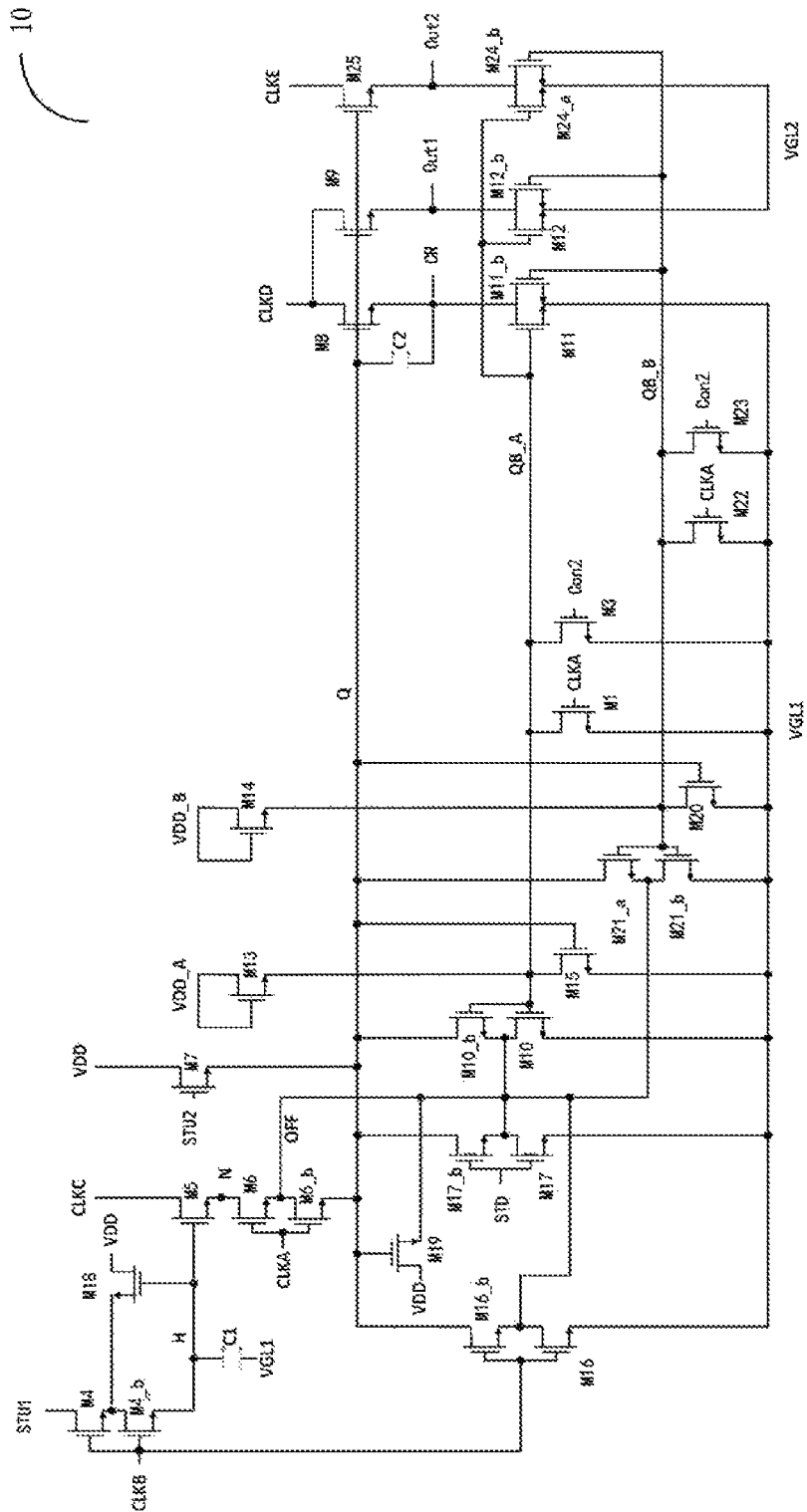
FIG. 13 is a circuit diagram of yet another specific implementation example of the shift register unit shown in FIG. 4B.

FIG. 13 is a circuit diagram of still another specific implementation example of the shift register unit shown in FIG. 4B. Referring to FIG. 13, the shift register unit 10 of this embodiment is substantially the same as the shift register unit 10 described in FIG. 9, except that the shift register unit 10 of this embodiment further includes more leakage prevention circuits and includes two pixel signal output terminals. Compared with the shift register unit 10 shown in FIG. 9, the shift register unit 10 in FIG. 13 further includes a plurality of transistors M20, M21_a, M21_b, M22, M23, M11_b, M12_b, M24_a, M24_b, and the like.

For example, referring to FIG. 13, the shift register unit 10 of this embodiment includes two pixel signal output terminals (a first pixel signal output terminal Out1 and a second pixel signal output terminal Out2). In the shift register unit 10 of this embodiment, the eleventh transistor M11 and the transistor M11_b are used to reduce noise of the shift signal output terminal CR, the twelfth transistor M12 and the transistor M12_b are used to reduce noise of the first pixel signal output terminal Out1, and the transistor M24_a and the transistor M24_b are used to reduce noise of the second pixel signal output terminal Out2. Gates of the eleventh transistor M11, the twelfth transistor M12 and the transistor M24_a are all coupled to a first second node QB_A, and gates of the transistor M11_b, the transistor M12_b and the transistor M24_b are all coupled to a second node QB_B. The first transistor M1, the third transistor M3, the thirteenth transistor M13, and the fifteenth transistor M15 are used to control the level of the first second node QB_A, and similarly, the transistor M20, the transistor M22, the transistor M23, and the fourteenth transistor M14 are used to control the level of the second node QB_B.

For example, the first pixel signal output terminal Out1 is coupled in a similar manner with the pixel signal output terminal Out described above. The second pixel signal output terminal Out2 is coupled to a second electrode of a twenty-fifth transistor M25, a gate of the twenty-fifth transistor M25 is coupled to the first node Q, and the first electrode of the twenty-fifth transistor M25 is coupled to the fifth clock signal terminal CLKE. A gate of the transistor M24_a is configured to be coupled to the first second node QB_A, a first electrode of the transistor M24_a is configured to be coupled to the second pixel signal output terminal Out2, and a second electrode of the transistor M24_a is configured to be coupled to the third voltage terminal VGL2 to receive the third voltage; a gate of the transistor M24_B is configured to be coupled to the second node QB_B, a first electrode of the transistor M24_b is configured to be coupled to the second pixel signal output terminal Out2, and a second electrode of the transistor M24_b is configured to be coupled to the third voltage terminal VGL2 to receive the third voltage.

Figure 14:
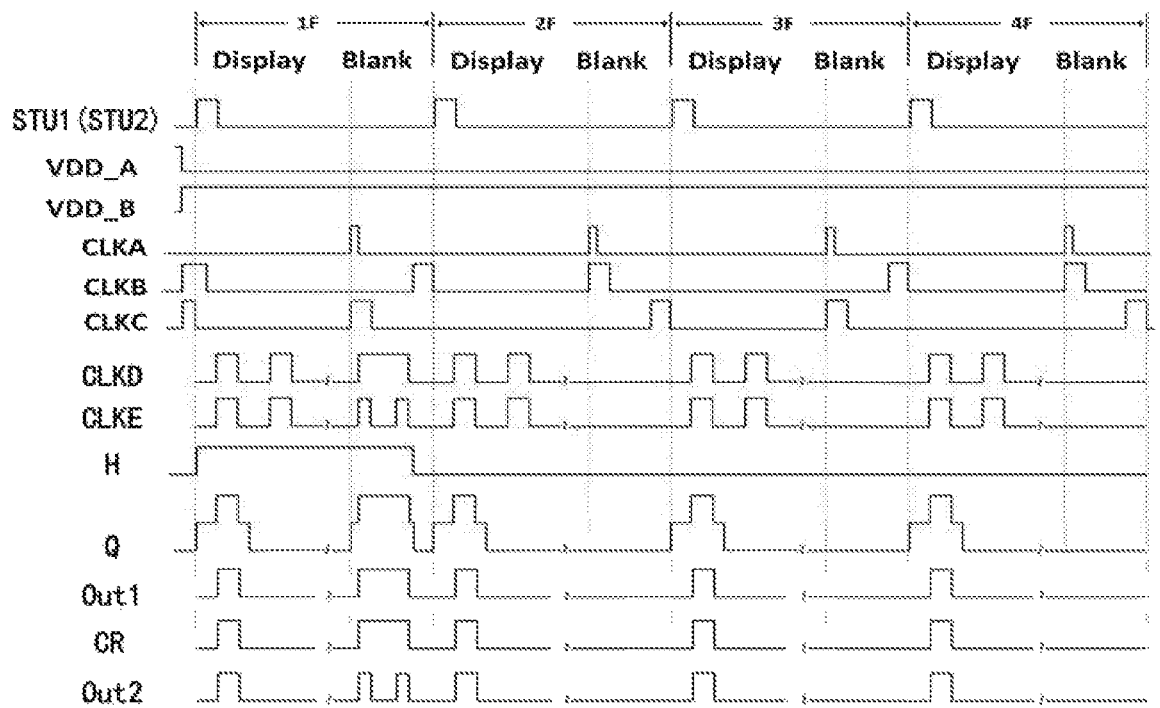
FIG. 14 is a timing diagram illustrating signals of another shift register unit according to some embodiments of the present disclosure.

FIG. 14 is a timing diagram of signals of another shift register unit according to some embodiments of the present disclosure. When the first node Q is at a high level, the ninth transistor M9 and the twenty-fifth transistor M25 are turned on, the fourth clock signal of the fourth clock signal terminal CLKD is output to the first pixel signal output terminal Out1, and the fifth clock signal of the fifth clock signal terminal CLKE is output to the second pixel signal output terminal Out2. For example, in one example, the fourth clock signal terminal CLKD and the fifth clock signal terminal CLKE provide the same clock signal, and thus the signals output by the first pixel signal output terminal Out1 and the second pixel signal output terminal Out2 are the same to further improve the driving capability. For example, in another example, the fourth clock signal terminal CLKD and the fifth clock signal terminal CLKE provide different signals, whose timing diagrams are shown in FIG. 14, so that the signals output by the first pixel signal output terminal Out1 and the second pixel signal output terminal Out2 are different, so as to provide various driving signals for the pixel unit.

It should be noted that the connection manner and function of the remaining transistors in the shift register unit 10 shown in FIG. 13 are similar to those of the remaining transistors in the shift register unit 10 shown in FIG. 9, and the working principle of the shift register unit 10 is similar to that of the shift register unit 10 described above, which can be understood by those skilled in the art and will not be described herein again.

At least one embodiment of the present disclosure provides a shift register unit including a blanking input circuit, a display input circuit, an output circuit, a first control circuit, and a third control circuit. The blanking input circuit is configured to input a blanking pull-up signal to the first node in a blanking period of one frame according to a blanking input signal. The display input circuit is configured to input a display pull-up signal to the first node in a display period of one frame in response to a display input signal. The output circuit is configured to output a composite output signal to an output terminal under the control of a level of the first node. The first control circuit is configured to control a level of the second node under the control of a level of the first node. The third control circuit is configured to control a level of the second node in response to a display pull-down control signal.

Figure 15:
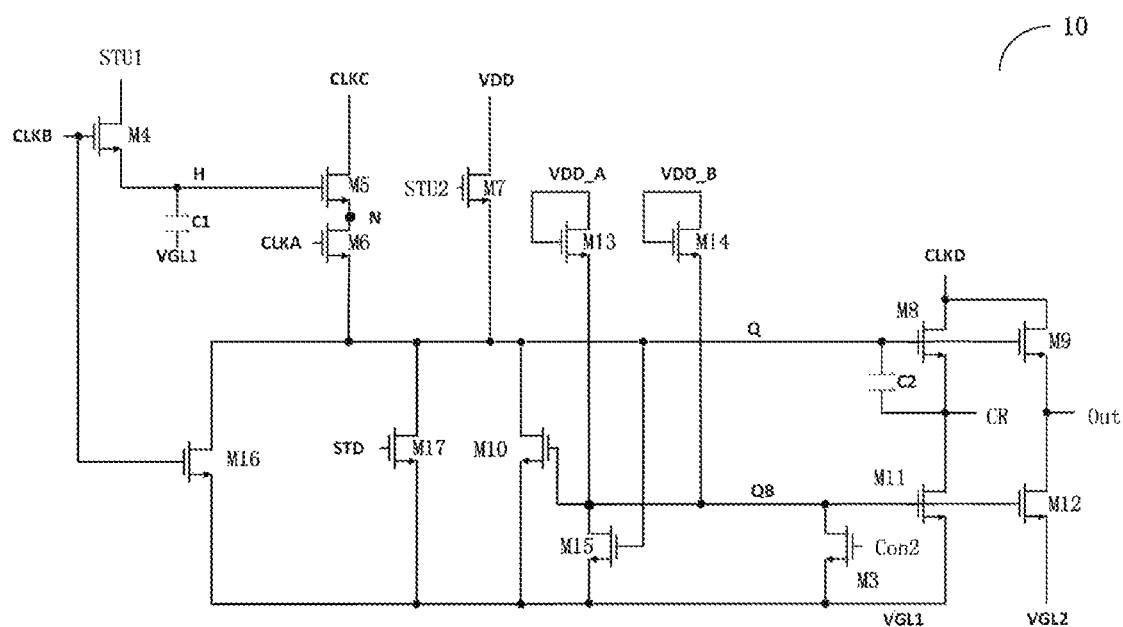
FIG. 15 is a circuit diagram of a specific implementation example of a shift register unit according to some embodiments of the present disclosure.

FIG. 15 is a circuit diagram of a specific implementation example of a shift register unit according to some embodiments of the present disclosure. Referring to FIG. 15, the shift register unit 10 of this embodiment is substantially the same as the shift register unit 10 described in FIG. 7, except that the shift register unit does not include the second control circuit 600 (the first transistor M1). The shift register unit does not include the first transistor M1, that is, the shift register unit pulls down the second node QB only by the first control circuit 500 (the thirteenth transistor M13, the fourteenth transistor M14, and the fifteenth transistor M15) and does not pull down the second node QB by any other transistor during the blanking period. The shift register unit pulls down the second node QB through the third control circuit 700 (the third transistor M3) and the first control circuit 500 together in the display period, so that the influence of the threshold voltage shift (such as positive shift) of the transistor on the output signal in the display period can be prevented, the reliability of the circuit is enhanced, and the display quality is improved. The operation principle of the shift register unit 10 is substantially the same as that of the shift register unit 10 described in FIG. 7, and is not described herein again.

At least one embodiment of the present disclosure further provides a gate driving circuit. The gate driving circuit includes the shift register unit according to any embodiment of the disclosure. The gate driving circuit has a simple circuit structure, can prevent the threshold voltage of the transistor from shifting to influence the output signal, and enhances the reliability of the circuit.

Figure 16:
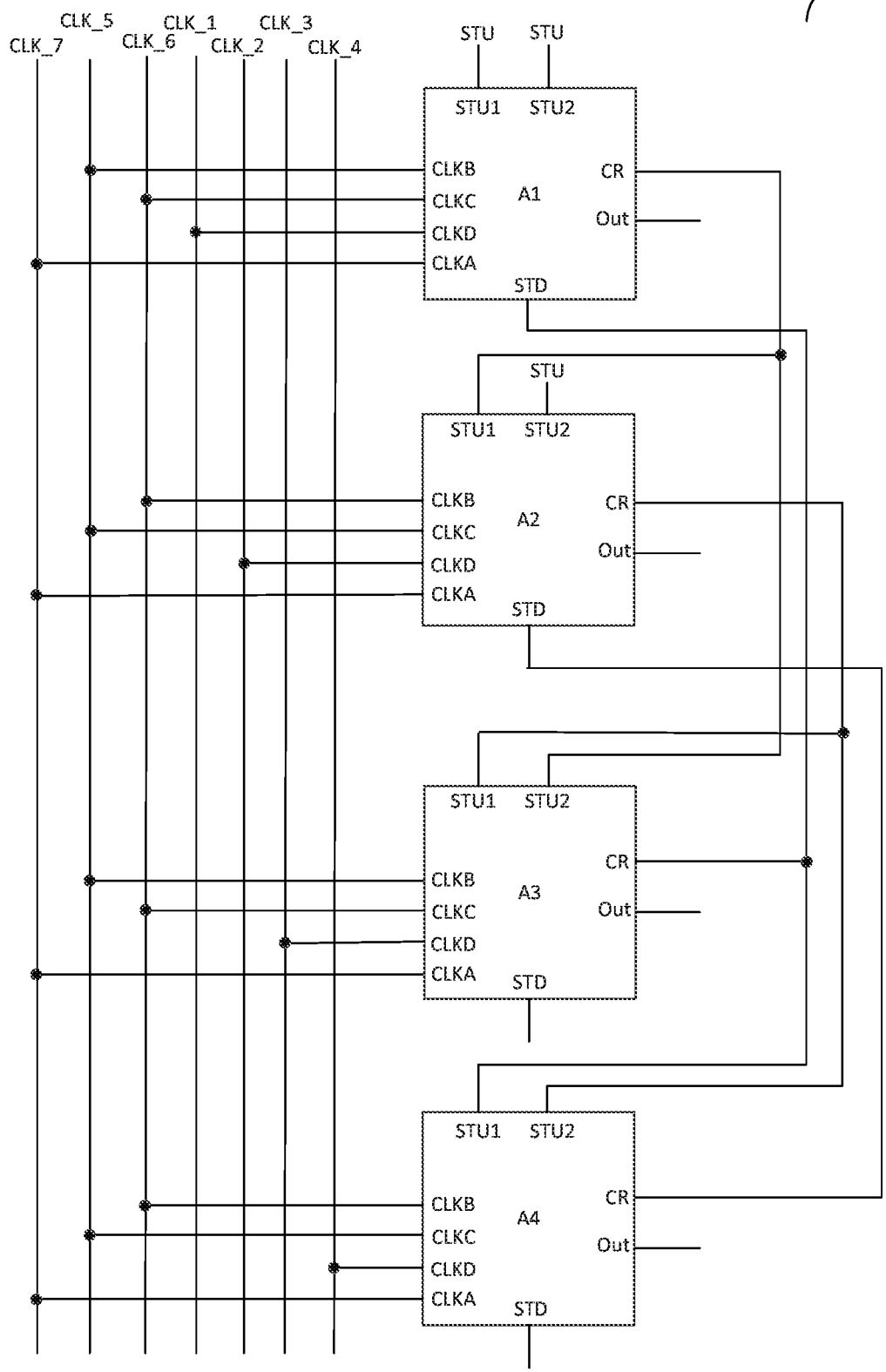
FIG. 16 is a schematic block diagram of a gate driving circuit according to some embodiments of the present disclosure.

FIG. 16 is a schematic block diagram of a gate driving circuit provided in some embodiments of the present disclosure. Referring to FIG. 16, the gate driving circuit 20 includes a plurality of shift register units (A1, A2, A3, A4, etc.) which are cascaded. The number of the plurality of shift register units is not limited and may be determined according to actual requirements. For example, the shift register unit employs the shift register unit 10 described in any embodiment of the present disclosure. For example, in the gate driving circuit 20, a part or all of the shift register units each may employ the shift register unit according to any one of the embodiments of the present disclosure. For example, the gate driving circuit 20 may be directly integrated on an array substrate of a display device by using the same process as that of a thin film transistor to realize a progressive scan driving function.

For example, each shift register unit has a blanking input signal terminal STU 1, a display input signal terminal STU2, first to fourth clock signal terminals CLKA-CLKD, a display reset signal terminal STD, a shift signal output terminal CR, a pixel signal output terminal Out, and the like. For example, the blanking input signal terminal STU1 of the shift register unit of each stage, except for the first stage, is coupled to the shift signal output terminal CR of the shift register unit of an adjacent previous stage. For example, the display input signal terminal STU2 of the shift register unit of each stage, except for the first stage and the second stage, is coupled to the shift signal output terminals CR of the shift register units of two adjacent previous stages. For example, the display reset signal terminal STD of the shift register unit of each stage, except for the last two stages, is coupled to the shift signal output terminals CR of the shift register units of the next two adjacent stages. That is, the blanking input signal terminal STU1 of the shift register unit of the Q1$^{th}$ stage other than the shift register unit of the first stage is coupled to the shift signal output terminal CR of the shift register unit of the (Q1−1)$^{th}$ stage, and Q1 is an integer greater than 1. For example, the display input signal terminal STU2 of the shift register unit of the Q2$^{th}$ stage, except the shift register units of the first and the second stages, is coupled to the shift signal output terminal CR of the shift register unit of the (Q2−2)$^{th}$ stage, and Q2 is an integer greater than 2. For example, the display reset signal terminal STD of the shift register unit of the Q3$^{th}$ stage, except for the shift register units of the last two stages, is coupled to the shift signal output terminal CR of the shift register unit of the (Q3+2)$^{th}$ stage, and Q3 is an integer greater than 0.

For example, the blanking input signal terminal STU1 and the display input signal terminal STU2 of the shift register unit A1 of the first stage are coupled to a trigger signal line STU, and the display input signal terminal STU2 of the shift register unit A2 of the second stage is also coupled to the trigger signal line STU. The display reset signal terminals STD of the shift register units A3-A4 of the last two stages are coupled to separately provided reset signal lines. The pixel signal output terminal Out of each shift register unit is coupled to pixel units of a corresponding row to output the driving signal to the pixel units of the row.

For example, the gate driving circuit 20 further includes a first sub-clock signal line CLK_1, a second sub-clock signal line CLK_2, a third sub-clock signal line CLK_3, and a fourth sub-clock signal line CLK_4. The shift register unit of each stage is coupled to the first to fourth sub-clock signal lines as follows and so on.

The fourth clock signal terminal CLKD of the shift register unit of the (4n−3)$^{th}$ stage (e.g., the shift register unit A1 of the first stage) is coupled to the first sub-clock signal line CLK_1, the fourth clock signal terminal CLKD of the stage shift register unit of the (4n−2)$^{th}$ stage (e.g., the shift register unit of the second stage A2) is coupled to the second sub-clock signal line CLK_2, the fourth clock signal terminal CLKD of the shift register unit of the (4n−1)$^{th}$ stage (e.g., the shift register unit of the third stage A3) is coupled to the third sub-clock signal line CLK_3, and the fourth clock signal terminal CLKD of the shift register unit of the (4n)$^{th}$ stage (e.g., the shift register unit of the fourth stage A4) is coupled to the fourth sub-clock signal line CLK_4. Here, n is an integer greater than 0.

For example, the gate driving circuit 20 further includes a fifth sub-clock signal line CLK_5 and a sixth sub-clock signal line CLK_6. The shift register unit of each stage is coupled to the fifth and sixth sub-clock signal lines as follows and so on.

The second clock signal terminal CLKB of the shift register unit of the $(2m-1)^{th}$ stage (e.g., the shift register unit of the first stage A1 and the shift register unit of the third stage A3) is coupled to the fifth sub-clock signal line CLK_5, and the third clock signal terminal CLKC of the shift register unit of the $(2m-1)^{th}$ stage is coupled to the sixth sub-clock signal line CLK_6. The second clock signal terminal CLKB of the shift register unit of the $(2m)^{th}$ stage (e.g., the shift register unit of the second stage A2 and the shift register unit of the fourth stage A4) is coupled to the sixth sub-clock signal line CLK_6, and the third clock signal terminal CLKC of the shift register unit of the $(2m)^{th}$ stage is coupled to the fifth sub-clock signal line CLK_5. Here, m is an integer greater than 0.

For example, the gate driving circuit 20 further includes a seventh sub-clock signal line CLK_7 configured to be coupled to the first clock signal terminal CLKA of the shift register unit of each stage.

For example, in the gate driving circuit 20, the blanking input signal terminal STU1 of the shift register unit of the $(k+1)^{th}$ stage and the shift signal output terminal CR of the shift register unit of the $k^{th}$ stage are coupled to each other. Here, k is an integer greater than 0.

For example, the gate driving circuit 20 may further include a timing controller T-CON configured for example to provide the respective clock signals to the shift register unit of each stage, and the timing controller T-CON may be further configured to provide a trigger signal and a reset signal. It should be noted that the phase relationship between the plurality of clock signals provided by the timing controller T-CON may be determined according to actual requirements. In different examples, more clock signals may also be provided, depending on different configurations. For example, the gate driving circuit 20 further includes a plurality of voltage lines to supply a plurality of voltage signals to the respective stages of the shift register units.

For example, when the gate driving circuit 20 is used to drive a display panel, the gate driving circuit 20 may be disposed at one side of the display panel. For example, the display panel includes a plurality of rows of gate lines, and the pixel signal output terminals Out of the shift register units of the respective stages in the gate driving circuit 20 may be configured to be coupled to the plurality of rows of gate lines, respectively, for outputting driving signals. Of course, the gate driving circuits 20 may be disposed on two sides of the display panel to realize bilateral driving, and the arrangement of the gate driving circuits 20 is not limited in the embodiment of the present disclosure. For example, the gate driving circuit 20 may be disposed at one side of the display panel for driving the gate lines of the odd-numbered rows, and the gate driving circuit 20 may be disposed at the other side of the display panel for driving the gate lines of the even-numbered rows.

Figure 17:
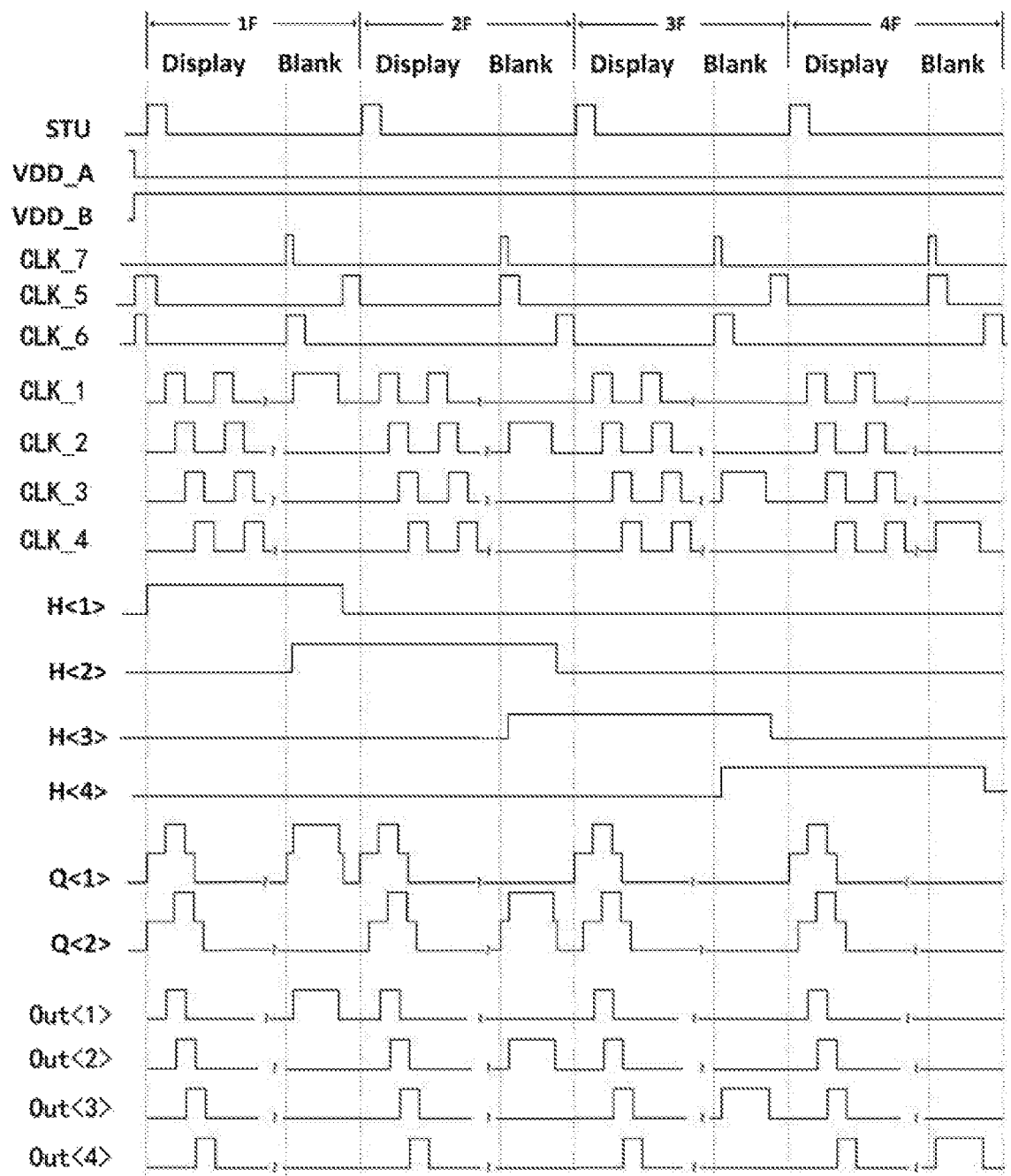
FIG. 17 is a timing diagram illustrating signals of a gate driving circuit according to some embodiments of the present disclosure.

FIG. 17 is a timing diagram of signals of a gate driving circuit according to some embodiments of the present disclosure, the timing diagram being the timing of the gate driving circuit 20 shown in FIG. 17, and the shift register unit in the gate driving circuit 20 being the shift register unit 10 shown in FIG. 7. The working principle of the gate driving circuit 20 can refer to the corresponding description of the shift register unit 10 in the embodiment of the present disclosure, and is not described in detail herein.

The shift register unit 10 of the respective stages in the gate driving circuit 20 output driving signals stage by stage in a display period until the last stage of the shift register unit 10 outputs the driving signal to complete a display of one frame. In the blanking period, the shift signal output terminal CR of the shift register unit 10 of the $n^{th}$ stage outputs a high level signal (the shift signal output terminal CR outputs the same output signal as the pixel signal output terminal Out), which is input to the blanking input signal terminal STU1 of the shift register unit of the $(n+1)^{th}$ stage 10 as the blanking input signal to charge the control node H of the shift register unit of the $(n+1)^{th}$ stage 10, causing the shift signal output terminal CR of the shift register unit of the $(n+1)^{th}$ stage 10 to output a high level signal in the blanking period of the next frame.

The second clock signal terminal CLKB of the shift register unit 10 of the odd-numbered stage is coupled to the fifth sub-clock signal line CLK_5, and the second clock signal terminal CLKB of the shift register unit 10 of the even-numbered stage is coupled to the sixth sub-clock signal line CLK_6. Referring to FIG. 17, the fifth sub-clock signal CLK_5 and the sixth sub-clock signal CLK_6 are alternately at a high level at the end of the blanking period of each frame, thereby alternately inputting a high level to the second clock signal terminals CLKB of the shift register units 10 of the odd-numbered and even-numbered stages, to alternately reset the control node H and the first node Q of the shift register units 10 of the odd-numbered and even-numbered stages. When the second clock signal terminal CLKB of the shift register unit of the $n^{th}$ stage 10 is at a high level, the third clock signal terminal CLKC of the shift register unit of the $(n+1)^{th}$ stage 10 is at a high level, and the first clock signal terminal CLKA is at a low level, so that the sixth transistor M6 is turned off, and the high level will not be wrongly written into the first node Q of the shift register unit of the $(n+1)^{th}$ stage 10 due to the high level of the third clock signal terminal CLKC, thereby generating an abnormal output.

Referring to FIG. 17, the waveforms of the first, second, third, and fourth sub-clock signals CLK_1, CLK_2, CLK_3, and CLK_4 in the display period of one frame sequentially overlap 50% of the effective pulse width, and the waveforms of the first, second, third, and fourth sub-clock signals CLK_1, CLK_2, CLK_3, and CLK_4 in the blanking period of each frame sequentially shift. The waveforms of the output signals Out<1>, Out<2>, Out<3> and Out<4> of the pixel signal output terminals Out of the shift register units of the first to fourth stages A1 to A4 overlap with 50% of the effective pulse width in sequence in the display period of one frame, and the waveforms of the output signals Out<1>, Out<2>, Out<3> and Out<4> of the pixel signal output terminals Out of the shift register units of the first to fourth stages A1 to A4 in the blanking periods of the respective frames shift in sequence. Since the output signals of the gate driving circuit 20 are overlapped in the display period, a pre-charge function can be realized, the charging time of the pixel circuit can be shortened, and a high refresh rate can be advantageously realized.

It should be noted that, in the embodiments of the present disclosure, the gate driving circuit 20 is not limited to the cascade manner described in FIG. 16, and may be any applicable cascade manner. When the cascade manner or the clock signal changes, the output signals Out<1>, Out<2>, Out<3> and Out<4> of the pixel signal output terminals Out of the shift register units of the first to fourth stages A1-A4 will also change accordingly, for example, overlap 33% or 0% (i.e., not overlap) during the display period, to meet various application requirements.

Figure 18:
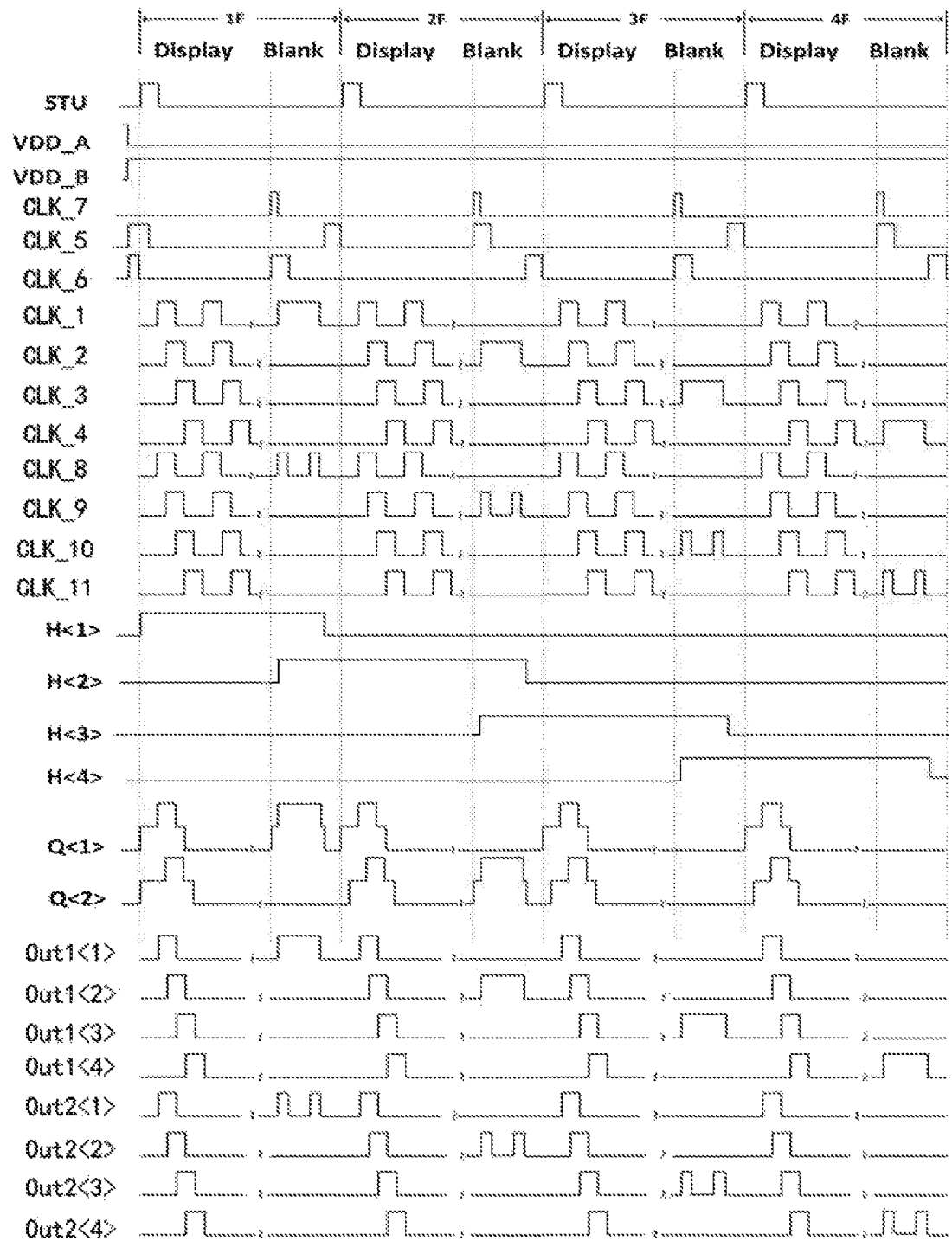
FIG. 18 is a timing diagram illustrating signals of another gate driving circuit according to some embodiments of the present disclosure.

FIG. 18 is a timing diagram of signals of another gate driving circuit according to some embodiments of the present disclosure, the timing diagram being the timing of the gate driving circuit 20 shown in FIG. 16, and the shift register unit in the gate driving circuit 20 being the shift register unit 10 shown in FIG. 13. The operation principle of the gate driving circuit 20 can be referred to the foregoing, and is not described in detail herein.

The gate driving circuit 20 further includes an eighth sub-clock signal line CLK_8, a ninth sub-clock signal line CLK_9, a tenth sub-clock signal line CLK_10, and an eleventh sub-clock signal line CLK_11 (not shown in FIG. 16). The fifth clock signal terminal CLKE of the shift register unit of the $(4n-3)^{th}$ stage (e.g., the shift register unit of the first stage A1) is coupled to the eighth sub-clock signal line CLK_8, the fifth clock signal terminal CLKE of the shift register unit of the $(4n-2)^{th}$ stage (e.g., the second stage shift register unit A2) is coupled to the ninth sub-clock signal line CLK_9, the fifth clock signal terminal CLKE of the shift register unit of the $(4n-1)^{th}$ stage (e.g., the shift register unit A3 of the third stage) is coupled to the tenth sub-clock signal line CLK_10, and the fifth clock signal terminal CLKE of the shift register unit the $(4n)^{th}$ stage (e.g., the shift register unit of the fourth stage A4) is coupled to the eleventh sub-clock signal line CLK_11. Here, n is an integer greater than 0.

Referring to FIG. 18, as for the shift register units of the first to fourth stages A1-A4, the waveforms of output signals Out2<1>, Out2<2>, Out2<3> and Out2<4> of the second pixel signal output terminals Out 2 are respectively the same as waveforms of the output signals Out1<1>, Out1<2>, Out1<3> and Out1<4> of the first pixel signal output terminals Out1 in a display period of one frame, and the waveforms of output signals Out2<1>, Out2<2>, Out2<3> and Out2<4> of the second pixel signal output terminals Out 2 are sequentially shifted and different from waveforms of output signals Out1<1>, Out1<2>, Out 1<3> and Out 1<4> of the first pixel signal output terminals Out1 in blanking periods of the respective frames, to satisfy various application requirements.

At least one embodiment of the present disclosure further provides a display device. The display device includes the gate driving circuit according to any embodiment of the disclosure. The gate driving circuit in the display device has a simple circuit structure, can prevent the threshold voltage of the transistor from shifting to influence the output signal, and enhances the reliability of the circuit.

Figure 19:
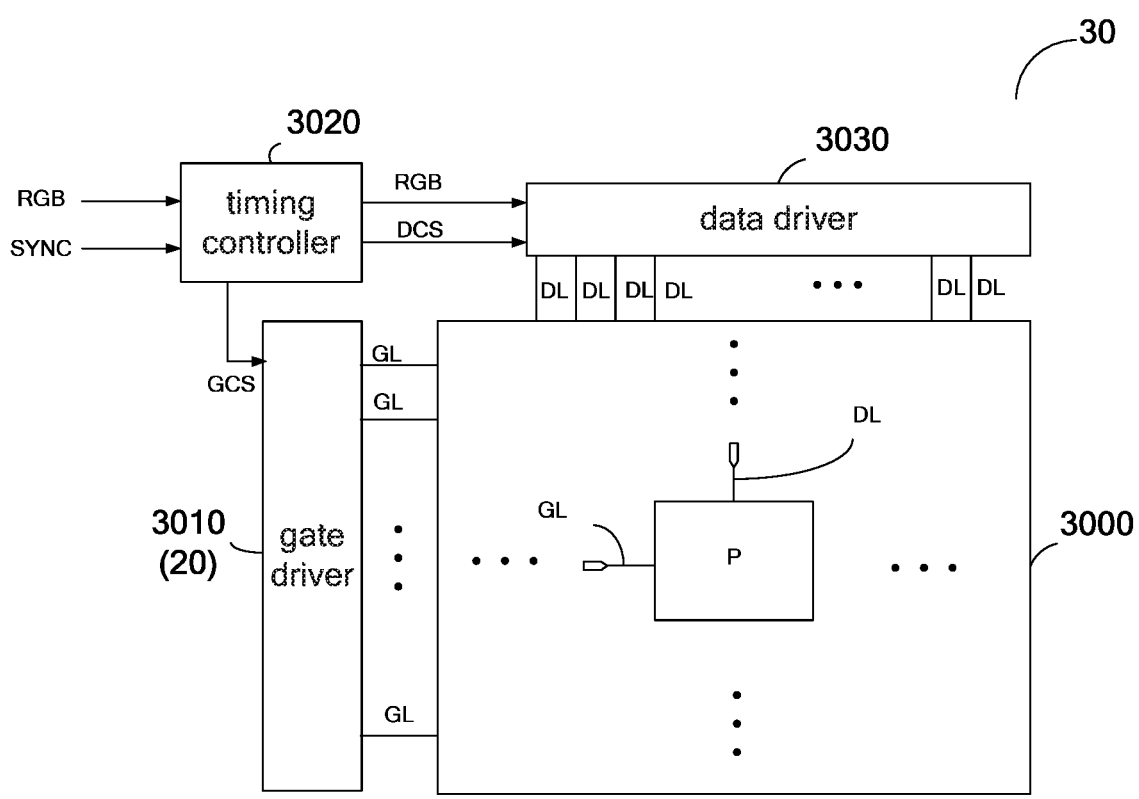
FIG. 19 is a schematic block diagram of a display device provided by some embodiments of the present disclosure.

FIG. 19 is a schematic block diagram of a display device provided by some embodiments of the present disclosure. Referring to FIG. 19, a display device 30 includes a gate driving circuit 20, and the gate driving circuit 20 is the gate driving circuit according to any embodiment of the present disclosure. For example, the display device 30 may be an OLED display panel, an OLED television, an OLED display, or other suitable products or components with display functions, which is not limited in this embodiment of the disclosure. The technical effect of the display device 30 can refer to the corresponding descriptions of the shift register unit 10 and the gate driving circuit 20 in the above embodiments, and the descriptions are not repeated here.

For example, in one example, the display device 30 includes a display panel 3000, a gate driver 3010, a timing controller 3020, and a data driver 3030. The display panel 3000 includes a plurality of pixel units P defined by intersections of a plurality of scan lines GL and a plurality of data lines DL; the gate driver 3010 is used to drive the plurality of scan lines GL; the data driver 3030 is configured to drive the plurality of data lines DL; the timing controller 3020 is used to process image data RGB input from the outside of the display device 30, supply the processed image data RGB to the data driver 3030, and output a scan control signal GCS and a data control signal DCS to the gate driver 3010 and the data driver 3030 to control the gate driver 3010 and the data driver 3030.

For example, the gate driver 3010 includes the gate driving circuit 20 provided in any of the above embodiments. The pixel signal output terminals Out of the plurality of shift register units 10 in the gate driving circuit 20 are correspondingly coupled to the plurality of scanning lines GL. The plurality of scanning lines GL are correspondingly coupled to the pixel units P arranged in a plurality of rows. The pixel signal output terminals Out of the shift register units 10 of the respective stages in the gate driving circuit 20 sequentially output signals to the plurality of scanning lines GL, so that the plurality of rows of pixel units P in the display panel 3000 are scanned line by line in the display period, and compensation detection is performed in the blanking period. For example, the gate driver 3010 may be implemented as a semiconductor chip or may be integrated in the display panel 3000 to form a GOA circuit.

For example, the data driver 3030 converts digital image data RGB input from the timing controller 3020 into data signals according to a plurality of data control signals DCS from the timing controller 3020 using a reference gamma voltage. The data driver 3030 supplies the converted data signals to the plurality of data lines DL. The data driver 3030 may be implemented as a semiconductor chip, for example.

For example, the timing controller 3020 processes externally input image data RGB to match the size and resolution of the display panel 3000 and then supplies the processed image data to the data driver 3030. The timing controller 3020 generates a plurality of scan control signals GCS and a plurality of data control signals DCS using synchronization signals (e.g., a dot clock DCLK, a data enable signal DE, a horizontal synchronization signal Hsync, and a vertical synchronization signal Vsync) input from the outside of the display device 30. The timing controller 3020 supplies the generated scan control signal GCS and data control signal DCS to the gate driver 3010 and the data driver 3030, respectively, for control of the gate driver 3010 and the data driver 3030.

The display device 30 may further include other components, such as a signal decoding circuit, a voltage conversion circuit, etc., which may be conventional components, and which will not be described in detail herein.

At least one embodiment of the present disclosure further provides a driving method of a shift register unit, which can be used to drive the shift register unit provided in any embodiment of the present disclosure, for example, the driving method can drive the shift register unit shown in FIG. 1A and FIG. 2. By using the driving method, the influence of the threshold voltage shift of the transistor on the output signal can be prevented, and the reliability of the circuit is enhanced.

For example, in an example, the driving method of the shift register unit 10 includes the following operations:

In a display period of one frame (i.e., one frame picture), the following are included:

A first pull-up stage, in which the display input circuit 200 inputs a display pull-up signal to the first node Q in response to a display input signal;

A first output stage, in which the output circuit 300 outputs the composite output signal to the output terminal Out under the control of the level of the first node Q;

In a blanking period of one frame, the following are included:

A second pull-up phase, in which the blanking input circuit 100 inputs a blanking pull-up signal to the first node Q according to a blanking input signal, and the second control circuit 600 controls the level of the second node QB in response to a blanking pull-down control signal;

A second output stage, in which the output circuit 300 outputs the composite output signal to the output terminal Out under the control of the level of the first node Q.

For example, in another example, in the case where the shift register unit 10 includes the third control circuit 700, the first pull-up stage of the driving method of the shift register unit 10 further includes: controlling, by the third control circuit 700, the level of the second node QB in response to the display pull-down control signal.

At least one embodiment of the present disclosure further provides another driving method of a shift register unit, which can be used to drive the shift register unit provided in any embodiment of the present disclosure, for example, the driving method can drive the shift register unit shown in FIG. 1B. By using the driving method, the influence of the threshold voltage shift of the transistor on the output signal can be prevented, and the reliability of the circuit is enhanced.

For example, in one example, the driving method of the shift register unit 10 includes the following operations:

In a display period of one frame (i.e., one frame picture), the following are included:

A first pull-up stage, in which the display input circuit 200 inputs a display pull-up signal to the first node Q in response to a display input signal, and the third control circuit 700 controls the level of the second node QB in response to a display pull-down control signal;

A first output stage, in which the output circuit 300 outputs the composite output signal to the output terminal Out under the control of the level of the first node Q;

In a blanking period of one frame, the following are included:

A second pull-up stage, in which the blanking input circuit 100 inputs a blanking pull-up signal to the first node Q according to the blanking input signal;

In the second output stage, the output circuit 300 outputs the composite output signal to the output terminal Out under the control of the level of the first node Q.

It should be noted that, for detailed description and technical effects of the driving method, reference may be made to corresponding descriptions of the shift register unit 10 and the gate driving circuit 20 in the embodiments of the present disclosure, which are not repeated herein.

The following points are needed to be explained:

(1) The drawings of the embodiments of the present disclosure only relate to the structures related to the embodiments of the present disclosure, and other structures can be referred to the conventional design.

(2) Without conflict, the embodiments and features of the embodiments of the present disclosure may be combined with one another to obtain new embodiments.

Although the embodiments of the present disclosure have been described above, the scope of the present disclosure should not be limited thereto, and the scope of the present disclosure should be determined by the scope of the claims.

What is claimed is:

1. A shift register unit, comprising a blanking input circuit, a display input circuit, an output circuit, a first control circuit and a second control circuit, wherein
   the blanking input circuit, the display input circuit, the output circuit and the first control circuit are coupled to a first node;
   the first control circuit and the second control circuit are coupled to a second node;
   the blanking input circuit is configured to input a blanking pull-up signal to the first node in a blanking period of one frame according to a blanking input signal and a blanking pull-down control signal;
   the display input circuit is configured to input a display pull-up signal to the first node in a display period of the frame in response to a display input signal;
   the output circuit is configured to output a composite output signal to an output terminal under the control of a level of the first node;
   the first control circuit is configured to control a level of the second node under the control of the level of the first node; and
   the second control circuit is configured to pull down the level of the second node in the blanking period of one frame in response to the blanking pull-down control signal,
   the shift register unit further comprises a third control circuit,
   wherein the third control circuit is configured to pull down the level of the second node in the display period of one frame in response to the display input signal.

2. The shift register unit of claim 1, further comprising a noise reduction circuit,
   wherein the noise reduction circuit is configured to reduce noise of the first node and the output terminal under the control of the level of the second node.

3. The shift register unit of claim 2, wherein the blanking input circuit comprises:
   a charging sub-circuit configured to input the blanking input signal to a control node in response to a second clock signal;
   a storage sub-circuit configured to store the blanking input signal input by the charging sub-circuit; and
   an isolation sub-circuit configured to input the blanking pull-up signal to the first node under the control of a level of the control node and a first clock signal,
   the charging sub-circuit comprises a fourth transistor having a gate configured to be coupled to a second clock signal terminal to receive the second clock signal, a first electrode configured to be coupled to a blanking input signal terminal to receive the blanking input signal, and a second electrode configured to be coupled to the control node;
   the storage sub-circuit comprises a first capacitor having a first electrode configured to be coupled to the control node and a second electrode configured to be coupled to a first voltage terminal to receive a first voltage; and
   the isolation circuit comprises a fifth transistor and a sixth transistor, a gate of the fifth transistor is configured to be coupled to the control node, a first electrode of the fifth transistor is configured to receive the blanking pull-up signal, a second electrode of the fifth transistor is configured to be coupled to a first electrode of the sixth transistor, a gate of the sixth transistor is configured to be coupled to a first clock signal terminal to receive the first clock signal, and a second electrode of the sixth transistor is configured to be coupled to the first node.

4. The shift register unit of claim 3, wherein the first electrode of the fifth transistor is coupled to a third clock signal terminal to receive a third clock signal as the blanking pull-up signal,
wherein the display input circuit comprises a seventh transistor;
a gate of the seventh transistor is configured to be coupled to a display input signal terminal to receive the display input signal, a first electrode of the seventh transistor is configured to receive the display pull-up signal, and a second electrode of the seventh transistor is configured to be coupled to the first node.

5. The shift register unit of claim 4, wherein the first electrode of the seventh transistor is coupled to a second voltage terminal to receive a second voltage as the display pull-up signal.

6. The shift register unit of claim 2, wherein the output circuit comprises at least one shift signal output terminal and at least one pixel signal output terminal.

7. The shift register unit of claim 6, wherein the output circuit comprises an eighth transistor, a ninth transistor and a second capacitor;
a gate of the eighth transistor is configured to be coupled to the first node, a first electrode of the eighth transistor is configured to receive the composite output signal, and a second electrode of the eighth transistor is configured to be coupled to the shift signal output terminal;
a gate of the ninth transistor is configured to be coupled to the first node, a first electrode of the ninth transistor is configured to receive the composite output signal, and a second electrode of the ninth transistor is configured to be coupled to the pixel signal output terminal; and
a first electrode of the second capacitor is configured to be coupled to the first node, and a second electrode of the second capacitor is configured to be coupled to the second electrode of the eighth transistor.

8. The shift register unit of claim 7, wherein the first electrode of the eighth transistor is coupled to a fourth clock signal terminal to receive a fourth clock signal as the composite output signal, and
the first electrode of the ninth transistor is coupled to the fourth clock signal terminal to receive the fourth clock signal as the composite output signal.

9. The shift register unit of claim 8, wherein the noise reduction circuit comprises a tenth transistor, an eleventh transistor, and a twelfth transistor;
a gate of the tenth transistor is configured to be coupled to the second node, a first electrode of the tenth transistor is configured to be coupled to the first node, and a second electrode of the tenth transistor is configured to be coupled to a first voltage terminal to receive a first voltage;
a gate of the eleventh transistor is configured to be coupled to the second node, a first electrode of the eleventh transistor is configured to be coupled to the shift signal output terminal, and a second electrode of the eleventh transistor is configured to be coupled to the first voltage terminal to receive the first voltage;
a gate of the twelfth transistor is configured to be coupled to the second node, a first electrode of the twelfth transistor is configured to be coupled to the pixel signal output terminal, and a second electrode of the twelfth transistor is configured to be coupled to a third voltage terminal to receive a third voltage.

10. The shift register unit of claim 2, wherein the first control circuit comprises a thirteenth transistor, a fourteenth transistor and a fifteenth transistor;
a gate and a first electrode of the thirteenth transistor are coupled together and configured to be coupled to a fourth voltage terminal to receive a fourth voltage, and a second electrode of the thirteenth transistor is configured to be coupled to the second node;
a gate and a first electrode of the fourteenth transistor are coupled together and configured to be coupled to a fifth voltage terminal to receive a fifth voltage, and a second electrode of the fourteenth transistor is configured to be coupled to the second node;
a gate of the fifteenth transistor is configured to be coupled to the first node, a first electrode of the fifteenth transistor is configured to be coupled to the second node, and a second electrode of the fifteenth transistor is configured to be coupled to a first voltage terminal to receive a first voltage.

11. The shift register unit of claim 2, further comprising a blanking reset circuit,
wherein the blanking reset circuit is configured to reset the first node in response to a blanking reset signal.

12. The shift register unit of claim 11, wherein the blanking reset circuit comprises a sixteenth transistor;
a gate of the sixteenth transistor is configured to receive the blanking reset signal, a first electrode of the sixteenth transistor is configured to be coupled to the first node, and a second electrode of the sixteenth transistor is configured to be coupled to a first voltage terminal to receive a first voltage.

13. The shift register unit of claim 12, wherein the gate of the sixteenth transistor is coupled to a second clock signal terminal to receive a second clock signal as the blanking reset signal.

14. The shift register unit of claim 2, further comprising a display reset circuit,
wherein the display reset circuit is configured to reset the first node in response to a display reset signal.

15. The shift register unit of claim 14, wherein the display reset circuit comprises a seventeenth transistor;
a gate of the seventeenth transistor is configured to be coupled to a display reset signal terminal to receive the display reset signal, a first electrode of the seventeenth transistor is configured to be coupled to the first node, and a second electrode of the seventeenth transistor is configured to be coupled to a first voltage terminal to receive a first voltage.

16. The shift register unit of claim 1, wherein the second control circuit comprises a first transistor, and the blanking pull-down control signal comprises a first clock signal; and
a gate of the first transistor is configured to be coupled to a first clock signal terminal to receive the first clock signal, a first electrode of the first transistor is configured to be coupled to the second node, and a second electrode of the first transistor is configured to receive a first voltage of a first voltage terminal.

17. The shift register unit of claim 16, wherein the second control circuit further comprises a second transistor, and the blanking pull-down control signal further comprises a first control signal;
a gate of the second transistor is configured to be coupled to a first control signal terminal to receive the first control signal, a first electrode of the second transistor is configured to be coupled to the second electrode of the first transistor, and a second electrode of the second transistor is configured to be coupled to the first voltage terminal to receive the first voltage.

18. The shift register unit of claim 1, wherein the third control circuit comprises a third transistor;
   a gate of the third transistor is configured to be coupled to a display pull-down control signal terminal to receive the display pull-down control signal, a first electrode of the third transistor is configured to be coupled to the second node, and a second electrode of the third transistor is configured to be coupled to a first voltage terminal to receive a first voltage.

19. A gate driving circuit, comprising a plurality of shift register units, which are cascaded in multiple stages, and each of which is the shift register unit of claim 1.

20. The gate driving circuit of claim 19, further comprising a first sub-clock signal line, a second sub-clock signal line, a third sub-clock signal line, and a fourth sub-clock signal line; wherein,
   in a case where the shift register unit comprises a fourth clock signal terminal,
   the fourth clock signal terminal of the shift register unit of the $(4n-3)^{th}$ stage of the multiple stages is coupled to the first sub-clock signal line;
   the fourth clock signal terminal of the shift register unit of the $(4n-2)^{th}$ stage of the multiple stages is coupled to the second sub-clock signal line;
   the fourth clock signal terminal of the shift register unit of the $(4n-1)^{th}$ stage of the multiple stages is coupled to the third sub-clock signal line;
   the fourth clock signal terminal of the shift register unit of the $(4n)^{th}$ stage of the multiple stages is coupled to the fourth sub-clock signal line; and
   n is an integer greater than 0.

21. The gate driving circuit of claim 20, further comprising a fifth sub-clock signal line and a sixth sub-clock signal line;
   wherein, in a case where the shift register unit comprises a second clock signal terminal and a third clock signal terminal,
   the second clock signal terminal of the shift register unit of the $(2m-1)^{th}$ stage of the multiple stages is coupled to the fifth sub-clock signal line, and the third clock signal terminal of the shift register unit of the $(2m-1)^{th}$ stage of the multiple stages is coupled to the sixth sub-clock signal line;
   the second clock signal terminal of the shift register unit of the $(2m)^{th}$ stage of the multiple stages is coupled to the sixth sub-clock signal line, and the third clock signal terminal of the shift register unit of the $(2m)^{th}$ stage of the multiple stages is coupled to the fifth sub-clock signal line; and
   m is an integer greater than 0.

22. The gate driving circuit of claim 21, wherein, in a case where the shift register unit comprises a blanking input signal terminal and a shift signal output terminal,
   the blanking input signal terminal of the shift register unit of the $(k+1)^{th}$ stage of the multiple stages is coupled to the shift signal output terminal of the shift register unit of the $k^{th}$ stage of the multiple stages, and k is an integer greater than 0.

23. The gate driving circuit of claim 21, wherein, in a case where the shift register unit comprises a display input signal terminal and a shift signal output terminal,
   the display input signal terminal of the shift register unit of the $(k+2)^{th}$ stage of the multiple stages is coupled to the shift signal output terminal of the shift register unit of the $k^{th}$ stage of multiple stages, of the multiple stages, and k is an integer greater than 0.

24. A display device, comprising the gate driving circuit of claim 19.

25. A driving method of the shift register unit of claim 1, in the display period of one frame, the method comprises:
   a first pull-up stage, in which the display input circuit inputs the display pull-up signal to the first node in response to the display input signal; and
   a first output stage, in which the output circuit outputs the composite output signal to the output terminal under the control of the level of the first node; and
   in the blanking period of the frame, the method comprises:
   a second pull-up stage, in which the blanking input circuit inputs the blanking pull-up signal to the first node according to the blanking input signal, and the second control circuit controls the level of the second node in response to the blanking pull-down control signal; and
   a second output stage, in which the output circuit outputs the composite output signal to the output terminal under the control of the level of the first node.

26. The driving method of the shift register unit of claim 25, wherein in a case where the shift register unit comprises a third control circuit, the method further comprises: in the first pull-up stage, the third control circuit controls a level of the second node in response to a display pull-down control signal.

27. A shift register unit, comprising a blanking input circuit, a display input circuit, an output circuit, a first control circuit and a third control circuit, wherein,
   the blanking input circuit, the display input circuit, the output circuit and the first control circuit are coupled to a first node;
   the first control circuit and the third control circuit are coupled to a second node;
   the blanking input circuit is configured to input a blanking pull-up signal to the first node in a blanking period of one frame according to a blanking input signal;
   the display input circuit is configured to input a display pull-up signal to the first node in a display period of the frame in response to a display input signal;
   the output circuit is configured to output a composite output signal to an output terminal under the control of a level of the first node;
   the first control circuit is configured to control a level of the second node under the control of the level of the first node; and
   the third control circuit is configured to pull down the level of the second node in the display period of one frame in response to the display input signal.

28. A shift register unit, comprising a blanking input circuit, a display input circuit, an output circuit, a first control circuit and a second control circuit, wherein
   the blanking input circuit, the display input circuit, the output circuit and the first control circuit are coupled to a first node;
   the first control circuit and the second control circuit are coupled to a second node;
   the blanking input circuit is configured to input a blanking pull-up signal to the first node in a blanking period of one frame according to a blanking input signal and a blanking pull-down control signal;
   the display input circuit is configured to input a display pull-up signal to the first node in a display period of the frame in response to a display input signal;

the output circuit is configured to output a composite output signal to an output terminal under the control of a level of the first node;

the first control circuit is configured to control a level of the second node under the control of the level of the first node; and the second control circuit is configured to pull down the level of the second node in the blanking period of one frame in response to the blanking pull-down control signal, the shift register unit further comprises a a third control circuit, wherein the third control circuit is configured to pull down the level of the second node in the display period of one frame in response to the display input signal, the shift register unit further comprises a noise reduction circuit, wherein the noise reduction circuit is configured to reduce noise of the first node and the output terminal under the control of the level of the second node;

wherein the output circuit comprises at least one shift signal output terminal and at least one pixel signal output terminal;

wherein the output circuit comprises an eighth transistor, a ninth transistor and a second capacitor;

a gate of the eighth transistor is configured to be coupled to the first node, a first electrode of the eighth transistor is configured to receive the composite output signal, and a second electrode of the eighth transistor is configured to be coupled to the shift signal output terminal;

a gate of the ninth transistor is configured to be coupled to the first node, a first electrode of the ninth transistor is configured to receive the composite output signal, and a second electrode of the ninth transistor is configured to be coupled to the pixel signal output terminal; and a first electrode of the second capacitor is configured to be coupled to the first node, and a second electrode of the second capacitor is configured to be coupled to the second electrode of the eighth transistor, wherein the first electrode of the eighth transistor is coupled to a fourth clock signal terminal to receive a fourth clock signal as the composite output signal, and the first electrode of the ninth transistor is coupled to the fourth clock signal terminal to receive the fourth clock signal as the composite output signal, wherein the noise reduction circuit comprises a tenth transistor, an eleventh transistor, and a twelfth transistor;

a gate of the tenth transistor is configured to be coupled to the second node, a first electrode of the tenth transistor is configured to be coupled to the first node, and a second electrode of the tenth transistor is configured to be coupled to a first voltage terminal to receive a first voltage;

a gate of the eleventh transistor is configured to be coupled to the second node, a first electrode of the eleventh transistor is configured to be coupled to the shift signal output terminal, and a second electrode of the eleventh transistor is configured to be coupled to the first voltage terminal to receive the first voltage;

a gate of the twelfth transistor is configured to be coupled to the second node, a first electrode of the twelfth transistor is configured to be coupled to the pixel signal output terminal, and a second electrode of the twelfth transistor is configured to be coupled to a third voltage terminal to receive a third voltage.

29. A shift register unit, comprising a blanking input circuit, a display input circuit, an output circuit, a first control circuit and a second control circuit, wherein the blanking input circuit, the display input circuit, the output circuit and the first control circuit are coupled to a first node;

the first control circuit and the second control circuit are coupled to a second node;

the blanking input circuit is configured to input a blanking pull-up signal to the first node in a blanking period of one frame according to a blanking input signal and a blanking pull-down control signal;

the display input circuit is configured to input a display pull-up signal to the first node in a display period of the frame in response to a display input signal;

the output circuit is configured to output a composite output signal to an output terminal under the control of a level of the first node;

the first control circuit is configured to control a level of the second node under the control of the level of the first node; and the second control circuit is configured to pull down the level of the second node in the blanking period of one frame in response to the blanking pull-down control signal, the shift register unit further comprises a a third control circuit, wherein the third control circuit is configured to pull down the level of the second node in the display period of one frame in response to the display input signal;

the shift register unit further comprises a noise reduction circuit, wherein the noise reduction circuit is configured to reduce noise of the first node and the output terminal under the control of the level of the second node;

the first control circuit comprises a thirteenth transistor, a fourteenth transistor and a fifteenth transistor;

a gate and a first electrode of the thirteenth transistor are coupled together and configured to be coupled to a fourth voltage terminal to receive a fourth voltage, and a second electrode of the thirteenth transistor is configured to be coupled to the second node;

a gate and a first electrode of the fourteenth transistor are coupled together and configured to be coupled to a fifth voltage terminal to receive a fifth voltage, and a second electrode of the fourteenth transistor is configured to be coupled to the second node;

a gate of the fifteenth transistor is configured to be coupled to the first node, a first electrode of the fifteenth transistor is configured to be coupled to the second node, and a second electrode of the fifteenth transistor is configured to be coupled to a first voltage terminal to receive a first voltage.

* * * * *